US012559672B2

(12) United States Patent
Liang et al.

(10) Patent No.: US 12,559,672 B2
(45) Date of Patent: Feb. 24, 2026

(54) D-A TYPE ORGANIC LIGHT-EMITTING MATERIAL AND APPLICATION THEREOF, LIGHT-EMITTING DEVICE, LIGHT-EMITTING SUBSTRATE AND LIGHT-EMITTING APPARATUS

(71) Applicant: BOE TECHNOLOGY GROUP CO., LTD., Beijing (CN)

(72) Inventors: Bingyan Liang, Beijing (CN); Siqi Wang, Beijing (CN); Dongxu Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 995 days.

(21) Appl. No.: 17/631,371

(22) PCT Filed: Dec. 15, 2020

(86) PCT No.: PCT/CN2020/136433
§ 371 (c)(1),
(2) Date: Jan. 28, 2022

(87) PCT Pub. No.: WO2022/126362
PCT Pub. Date: Jun. 23, 2022

(65) Prior Publication Data

US 2023/0018040 A1 Jan. 19, 2023

(51) Int. Cl.
*H10K 85/60* (2023.01)
*C09K 11/06* (2006.01)
*H10K 50/11* (2023.01)

(52) U.S. Cl.
CPC ............ *C09K 11/06* (2013.01); *H10K 85/633* (2023.02); *H10K 85/636* (2023.02); *C09K 2211/1007* (2013.01); *C09K 2211/1011* (2013.01); *C09K 2211/1018* (2013.01); *H10K 50/11* (2023.02); *H10K 85/615* (2023.02); *H10K 85/626* (2023.02); *H10K 85/6572* (2023.02)

(58) Field of Classification Search
None
See application file for complete search history.

(56) References Cited

U.S. PATENT DOCUMENTS

2014/0197381 A1* 7/2014 Kim .................. H10K 85/6565
257/40

FOREIGN PATENT DOCUMENTS

| | | | | |
|---|---|---|---|---|
| CN | 106893581 A | | 6/2017 | |
| CN | 110627659 A | | 12/2019 | |
| CN | 111662190 A | | 9/2020 | |
| JP | 4677221 B2 | | 4/2011 | |
| WO | WO-2020130511 A1 | * | 6/2020 | ........... H10K 85/636 |
| WO | 2020/138871 A1 | | 7/2020 | |
| WO | 2020/153745 A1 | | 7/2020 | |

OTHER PUBLICATIONS

Machine translation of WO-2020130511-A1, translation generated Aug. 2025, 18 pages. (Year: 2025).*

* cited by examiner

*Primary Examiner* — Robert S Loewe
(74) *Attorney, Agent, or Firm* — XSENSUS LLP

(57) ABSTRACT

A D-A type organic light-emitting material includes a donor moiety and an acceptor moiety. The donor moiety is represented as follows:

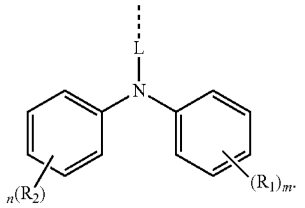

L is selected from any of aryl, heteroaryl, fused aryl and fused heteroaryl. When L is selected from any of aryl and heteroaryl, aryl and heteroaryl each have one or more substituents each selected from any of deuterium, tert-butyl, phenyl, cyano and methylimino, and at least one substituent is selected from cyano and methylimino. When L is selected from any of fused aryl and fused heteroaryl, fused aryl and fused to heteroaryl each have or do not have a substituent. When fused aryl and fused heteroaryl each have a substituent, the substituent is selected from any of deuterium, tert-butyl, phenyl, cyano and methylimino. The acceptor moiety is selected from any of a substituted or unsubstituted fused aromatic rings and a substituted or unsubstituted fused heterocyclic ring.

15 Claims, 3 Drawing Sheets

Table 1a

| | Molecular structure | HOMO distribution | LUMO distribution |
|---|---|---|---|
| Comparative example |  |  |  |
| Embodiment 1 |  |  |  |
| Embodiment 2 |  |  |  |

Table 1b

| | Molecular structure | HOMO distribution | LUMO distribution |
|---|---|---|---|
| Embodiment 3 |  |  |  |
| Embodiment 4 |  |  |  |
| Embodiment 5 |  |  |  |

D-A TYPE ORGANIC LIGHT-EMITTING MATERIAL AND APPLICATION THEREOF, LIGHT-EMITTING DEVICE, LIGHT-EMITTING SUBSTRATE AND LIGHT-EMITTING APPARATUS

CROSS-REFERENCE TO RELATED APPLICATION

This application is a national phase entry under 35 USC 371 of International Patent Application No. PCT/CN2020/136433 filed on Dec. 15, 2020, which is incorporated herein by reference in its entirety.

TECHNICAL FIELD

The present disclosure relates to the fields of illumination and display technologies, and in particular, to a D-A type organic light-emitting material and application thereof, a light-emitting device, a light-emitting substrate and a light-emitting apparatus.

BACKGROUND

An organic light-emitting diode (OLED) has characteristics of self-luminescence, wide viewing angle, short response time, high luminous efficiency, low operating voltage, small substrate thickness, being capable of being used to manufacture a large-sized and bendable substrate, simple manufacturing process and the like, and is known as a next-generation "star" display technology.

SUMMARY

In an aspect, a donor-acceptor (D-A) type organic light-emitting material including a donor moiety and an acceptor moiety is provided. The donor moiety is represented by a following formula (I):

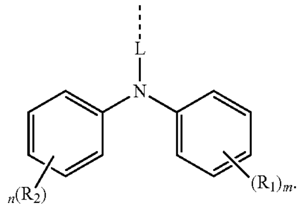

In the formula (I), L is selected from any one of divalent aryl, divalent heteroaryl, divalent fused aryl, and divalent fused heteroaryl, and m and n are each an integer from 0 to 3. In a case where L is selected from any one of divalent aryl and divalent heteroaryl, the divalent aryl and the divalent heteroaryl each have one or more substituents each selected from any one of deuterium, tert-butyl, phenyl, cyano and methylimino, and at least one substituent is selected from any one of cyano and methylimino, and a total number of the cyano and the methylimino is not more than 2. In a case where L is selected from any one of divalent fused aryl and divalent fused heteroaryl, the divalent fused aryl and the divalent fused heteroaryl each have or do not have a substituent. In a case where the divalent fused aryl and the divalent fused heteroaryl each have a substituent, the substituent is selected from any one of deuterium, tert-butyl, phenyl, cyano and methylimino, and a total number of the cyano and the methylimino is not more than 2. The acceptor moiety is selected from any one of a substituted or unsubstituted fused aromatic ring and a substituted or unsubstituted fused heterocyclic ring. A number of heteroatoms in the fused heterocyclic ring is not more than 2, and the substituent is R. R, $R_1$ and $R_2$ are same or different, and are each independently selected from any one of deuterium, halogen, cyano, nitro, amino, $C_1$ to $C_{40}$ alkyl, $C_2$ to $C_{40}$ alkenyl, $C_2$ to $C_{40}$ alkynyl, $C_3$ to $C_{40}$ cycloalkyl, $C_3$ to $C_{40}$ heterocycloalkyl, $C_6$ to $C_{60}$ aryl, $C_5$ to $C_{60}$ heteroaryl, $C_1$ to $C_{40}$ alkoxy, $C_6$ to $C_{60}$ aryloxy, $C_3$ to $C_{40}$ alkylsilyl, $C_6$ to $C_{60}$ arylsilyl, $C_1$ to $C_{40}$ alkylboryl, $C_6$ to $C_{60}$ arylboryl, $C_6$ to $C_{60}$ aryl phosphinyl, $C_6$ to $C_{60}$ mono- or diaryl phosphinyl, and $C_6$ to $C_{60}$ arylamine.

In some embodiments, R, $R_1$ and $R_2$ are each combined with a respective adjacent group to form a condensed ring.

In some embodiments, L is selected from any one of following structural formulas:

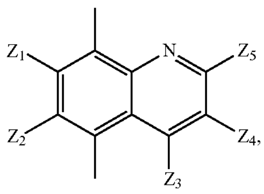

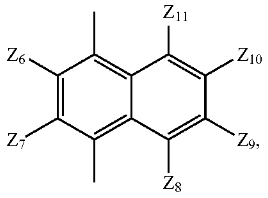

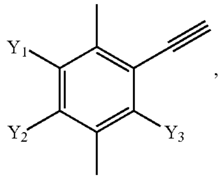

, and

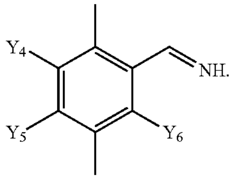

$Z_1$ to $Z_{11}$ are same or different, and are each independently selected from any one of hydrogen, deuterium, tert-butyl, phenyl, cyano and methylimino, and a total number of the cyano and the methylimino is not more than 2. $Y_1$ to $Y_6$ are same or different, and are each independently selected from any one of hydrogen, deuterium, tert-butyl, phenyl, cyano and methylimino, and there is at most one cyano or methylimino in $Y_1$ to $Y_3$, and there is at most one cyano or methylimino in $Y_4$ to $Y_6$.

In some embodiments, L is selected from any one of following structural formulas:

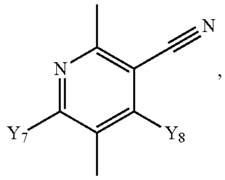

,

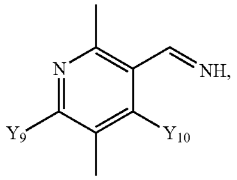

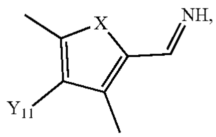

and

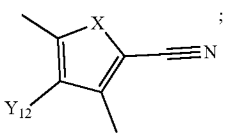

;

$Y_7$ to $Y_{12}$ are same or different, and are each independently selected from any one of hydrogen, deuterium, tert-butyl, phenyl, cyano and methylimino. Moreover, there is at most one cyano or methylimino in $Y_7$ and $Y_8$, there is at most one cyano or methylimino in $Y_9$ and $Y_{10}$. X is selected from any one of S, O, NH and N(R).

In some embodiments, the acceptor moiety is represented by a following structural formula:

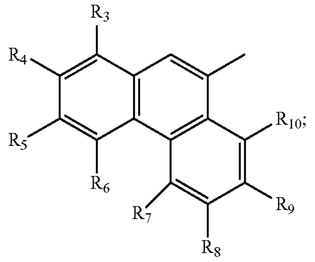

$R_3$ to $R_{10}$ are same or different, and are each independently selected from any one of hydrogen, deuterium, halogen, cyano, nitro, amino, $C_1$ to $C_{40}$ alkyl, $C_2$ to $C_{40}$ alkenyl, $C_2$ to $C_{40}$ alkynyl, $C_3$ to $C_{40}$ cycloalkyl, $C_3$ to $C_{40}$ heterocycloalkyl, $C_6$ to $C_{60}$ aryl, $C_5$ to $C_{60}$ heteroaryl, $C_1$ to $C_{40}$ alkoxy, $C_6$ to $C_{60}$ aryloxy, $C_3$ to $C_{40}$ alkylsilyl, $C_6$ to $C_{60}$ arylsilyl, $C_1$ to $C_{40}$ alkylboryl, $C_6$ to $C_{60}$ arylboryl, $C_6$ to $C_{60}$ aryl phosphinyl, $C_6$ to $C_{60}$ mono- or diaryl phosphinyl, and $C_6$ to $C_{60}$ arylamine.

In some embodiments, $R_3$ to $R_{10}$ are each combined with a respective adjacent group to form a condensed ring.

In some embodiments, a twist angle between the donor moiety and the acceptor moiety is in a range of 35 degrees to 80 degrees, inclusive.

In some embodiments, the twist angle between the donor moiety and the acceptor moiety is in a range of 45 degrees to 60 degrees, inclusive.

In some embodiments, in the D-A type organic light-emitting material, excitons in a triplet state and excitons in a singlet state are in a following relationship:

$$|TN-SM| \leq 0.2 \text{ eV}.$$

TN represents the triplet state at an N energy level, SM represents the singlet state at an M energy level, M is an integer greater than or equal to 1, and N is an integer greater than M.

In some embodiments, a radiation decay time of the D-A type organic light-emitting material is less than 30 ns.

In some embodiments, as a polarity of a solvent increases, a wavelength corresponding to a peak of an emission spectrum of the D-A type organic light-emitting material increases.

In some embodiments, the wavelength corresponding to the peak of the emission spectrum of the D-A type organic light-emitting material dissolved in n-hexane, ethyl ether, tetrahydrofuran and acetonitrile in sequence increases.

In another aspect, an application of the above D-A type organic light-emitting material in an organic electronic device is provided.

In yet another aspect, a light-emitting device is provided. The light-emitting device includes a light-emitting layer, a material of the light-emitting layer includes a host material and a guest material, and the guest material is the above D-A type organic light-emitting material.

In some embodiments, the host material is selected from any one or a combination of two or more of anthracene, aromatic amine compounds and derivatives thereof.

In some embodiments, a mass ratio of the D-A type organic light-emitting material in the light-emitting layer is in a range of 0.5% to 10%, inclusive.

In yet another aspect, a light-emitting substrate is provided. The light-emitting substrate includes a base and a plurality of light-emitting devices disposed on the base. At least one light-emitting device is the above light-emitting device.

In yet another aspect, a light-emitting apparatus is provided. The light-emitting apparatus includes the above light-emitting substrate.

BRIEF DESCRIPTION OF THE DRAWINGS

In order to describe technical solutions in the present disclosure more clearly, the accompanying drawings to be used in some embodiments of the present disclosure will be introduced briefly below. Obviously, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, and are not limitations on actual sizes of products, actual processes of methods and actual timings of signals to which the embodiments of the present disclosure relate.

DETAILED DESCRIPTION

Figure 1:
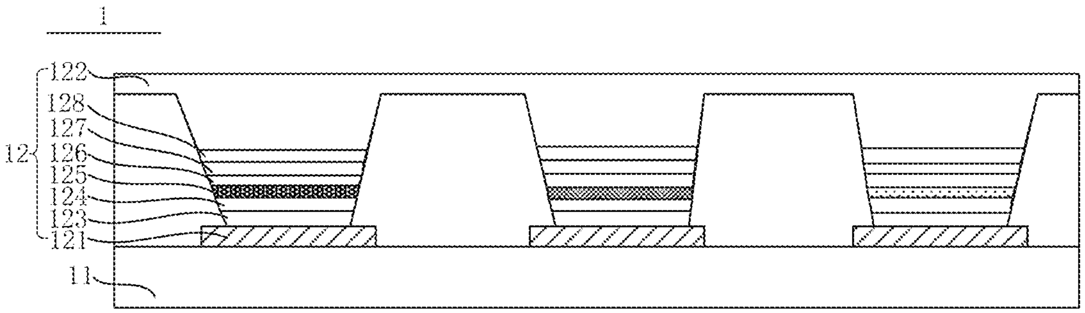
FIG. 1 is a sectional structural diagram of a light-emitting substrate, in accordance with some embodiments.

Technical solutions in some embodiments of the present disclosure will be described clearly and completely below with reference to the accompanying drawings. Obviously, the described embodiments are merely some but not all embodiments of the present disclosure. All other embodiments obtained based on the embodiments of the present disclosure by a person of ordinary skill in the art shall be included in the protection scope of the present disclosure.

Unless the context requires otherwise, throughout the description and the claims, the term "comprise" and other forms thereof such as the third-person singular form "comprises" and the present participle form "comprising" are construed as open and inclusive, i.e., "including, but not limited to." In the description, the term such as "one embodiment", "some embodiments", "exemplary embodiments", "example" "specific example" or "some examples" is intended to indicate that specific features, structures, materials, or characteristics related to the embodiment(s) or example(s) are included in at least one embodiment or example of the present disclosure. Schematic representations of the above terms do not necessarily refer to the same embodiment(s) or examples(s). In addition, the specific features, structures, materials or characteristics may be included in any one or more embodiments or examples in any suitable manner.

Hereinafter, the terms "first" and "second" are only used for descriptive purposes, and are not to be construed as indicating or implying relative importance or implicitly indicating the number of indicated technical features. Thus, features defined as "first" and "second" may explicitly or implicitly include one or more of the features. In the description of the embodiments of the present disclosure, the term "a plurality of" means two or more unless otherwise specified.

The phrase "at least one of A, B and C" has a same meaning as the phrase "at least one of A, B or C", and they both include the following combinations of A, B and C:

only A, only B, only C, a combination of A and B, a combination of A and C, a combination of B and C, and a combination of A, B and C.

The phrase "A and/or B" includes the following three combinations: only A, only B, and a combination of A and B.

The use of the phrase "applicable to" or "configured to" herein means an open and inclusive language, which does not exclude devices that are applicable to or configured to perform additional tasks or steps.

In addition, the use of the phase "based on" is meant to be open and inclusive, since a process, step, calculation or other action that is "based on" one or more of the stated conditions or values may, in practice, be based on additional conditions or values exceeding those stated.

Exemplary embodiments are described herein with reference to sectional views and/or plan views as idealized exemplary drawings. In the accompanying drawings, thicknesses of layers and regions are enlarged for clarity. Thus, variations in shape relative to the drawings due to, for example, manufacturing technologies and/or tolerances may be envisaged. Therefore, the exemplary embodiments should not be construed to be limited to the shapes of the regions shown herein, but to include deviations in the shapes due to, for example, manufacturing. For example, an etched region shown in a rectangular shape generally has a curved feature. Therefore, the regions shown in the accompanying drawings are schematic in nature, and their shapes are not intended to show actual shapes of the region in a device, and are not intended to limit the scope of the exemplary embodiments.

Figure 2:
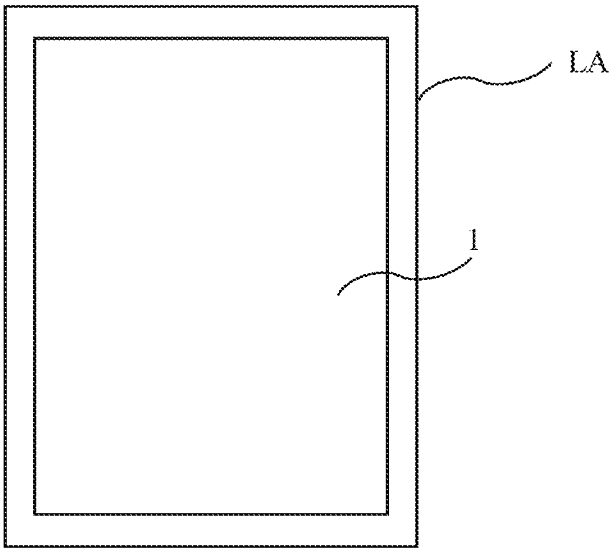
FIG. 2 is a structural diagram of a display apparatus, in accordance with some embodiments.

Some embodiments of the present disclosure provide a light-emitting apparatus, as shown in FIG. 2, the light-emitting apparatus LA includes a light-emitting substrate 1. Of course, the light-emitting apparatus may also include other components. For example, the light-emitting apparatus may include a circuit for providing electrical signals to the light-emitting substrate to drive the light-emitting substrate to emit light. The circuit may be referred to as a control circuit, and may include a circuit board electrically connected to the light-emitting substrate and/or an integrated circuit (IC) electrically connected to the light-emitting substrate.

In some embodiments, the light-emitting apparatus may be an illumination apparatus. In this case, the light-emitting substrate may be an illumination substrate, and may be used, for example, as a light source to implement an illumination function. For example, the light-emitting substrate may be a backlight module in a liquid crystal display apparatus, a lamp for internal or external illumination, a signal lamp, etc.

In some other embodiments, the light-emitting apparatus may be a display apparatus. In this case, the light-emitting substrate is a display substrate, and is used to implement a function of displaying images (i.e., pictures). The light-emitting apparatus may include a display or a product including a display. The display may be a flat panel display (FPD), a micro display, or the like. If classified according to whether a user may see scenes behind the display, the display may be a transparent display or an opaque display. If classified according to whether the display may be bent or rolled, the display may be a flexible display or a common display (which may be referred to as a rigid display). For example, the product including the display may include a computer display, a television, a billboard, a laser printer with a display function, a telephone, a mobile phone, a personal digital assistant (PDA), a laptop computer, a digital camera, a portable camcorder, a viewfinder, a vehicle, a large-area wall, a theater screen, a stadium sign, or the like.

In some embodiments, as shown in FIG. 1, the light-emitting substrate 1 may include a base 11 and a plurality of light-emitting devices 12 disposed on the base 11. The base 11 may be a flexible base or a rigid base. In a case where the base 11 is a flexible base, a material of the base 11 may be polyimide (PI). In a case where the base 11 is a rigid base, a material of the base 11 may be glass. Herein, the base 11 may be a base on which pixel driving circuits has been formed.

In some embodiments, each light-emitting device 12 may include an anode 121 and a cathode 122, and organic material layers such as a hole injection layer (HIL) 123, a hole transport layer (HTL) 124, a light-emitting layer (EML) 125, a hole blocking layer (HBL) 126, an electron transport layer (ETL) 127, and an electron injection layer (EIL) 128 that are disposed between the anode 121 and the cathode 122. The hole injection layer 123 is adjacent to the anode 121, and the electron injection layer 128 is adjacent to the cathode 122.

When voltages are applied to the cathode and the anode, electrons and holes move toward each other and are injected into the light-emitting layer 125 through the electron injection layer 128 and the hole injection layer 123, respectively, and then recombine in the light-emitting layer 125 to generate excitons, which are de-excited to achieve light emission.

Based on the above light-emitting mechanism, a material of the hole injection layer 123 may be selected from any one or a combination of two or more of aromatic tertiary amine and phthalocyanine and derivatives thereof; a material of the hole transport layer 124 may be selected from any one or a combination of two or more of aromatic amine and carbazole-based compounds; a material of the hole blocking layer 126 may be selected from any one or a combination of two or more of benzimidazole, triazine, pyrimidine and derivatives thereof; a material of the electron transport layer 127 may be selected from any one or a combination of two or more of benzimidazole, triazine, pyrimidine, pyridine, pyrazine, quinoxaline, quinoline, diazole, diazaphosphole, phosphine oxide, aromatic ketone, lactam, borane compounds and derivatives thereof; and a material of the electron injection layer 128 may be selected from any one or a combination of two or more of nitrogen-containing five-membered ring, fluorenone, anthraquinone dimethane, diphenoquinone, thiopyran dioxide, azole, diazole, triazole, imidazole, perylene tetracarboxylic acid, fluorenylidene methane, and anthrone and derivatives thereof. A material of the light-emitting layer 125 may include a host material and a guest material. The host material may be selected from any one or a combination of two or more of anthracene, aromatic amine compounds and derivatives thereof, and the guest material may be a donor-acceptor (D-A) type organic light-emitting material, which includes a donor moiety D and an acceptor moiety A.

In some embodiments, a donor moiety D of a D-A type organic light-emitting material in a light-emitting layer 125 of at least one light-emitting device 12 is represented by the following formula (I):

formula (I)

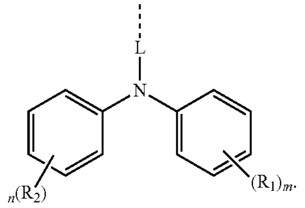

In the formula (I), L is selected from any one of divalent aryl, divalent heteroaryl, divalent fused aryl, and divalent fused heteroaryl. In a case where L is selected from any one of divalent aryl and divalent heteroaryl, the divalent aryl and the divalent heteroaryl each have one or more substituents each selected from any one of deuterium, tert-butyl, phenyl, cyano and methylimino, and at least one substituent is selected from any one of cyano and methylimino, and a total number of the cyano and the methylimino is not more than 2.

For example, in a case where L is divalent aryl, L may be selected from any one of the following formulas:

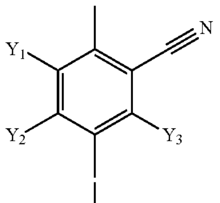

and

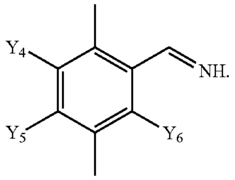

$Y_1$ to $Y_6$ are same or different, and are each independently selected from any one of hydrogen, deuterium, tert-butyl, phenyl, cyano and methylimino. Moreover, there is at most one cyano or methylimino in $Y_1$ to $Y_3$, and there is at most one cyano or methylimino in $Y_4$ to $Y_6$.

In this case, a structure of the formula (I) may be expressed as any one shown below.

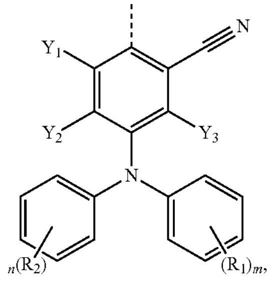

-continued

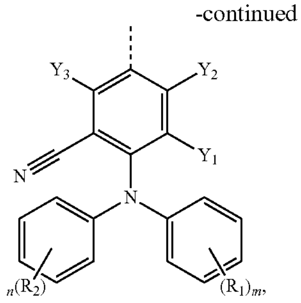

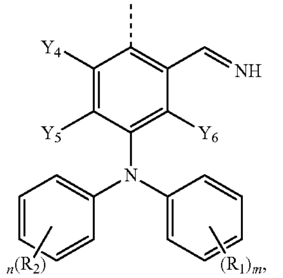

and

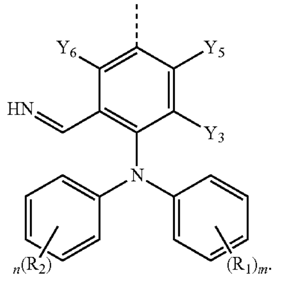

In a case where L is divalent heteroaryl, L may be selected from any one of the following formulas:

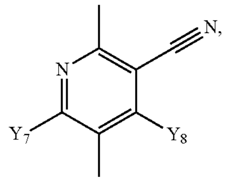

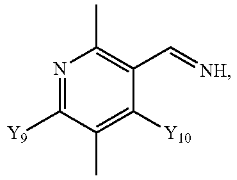

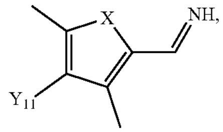

and

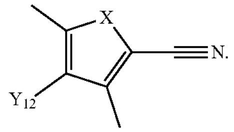

$Y_7$ to $Y_{12}$ are same or different, and are each independently selected from any one of hydrogen, deuterium, tert-butyl, phenyl, cyano and methylimino. Moreover, there is at most one cyano or methylimino in $Y_7$ and $Y_8$, there is at most one cyano or methylimino in $Y_9$ and $Y_{10}$, and X is selected from S, O, NH or N(R).

In this case, the structure of the formula (I) may be expressed as any one shown below.

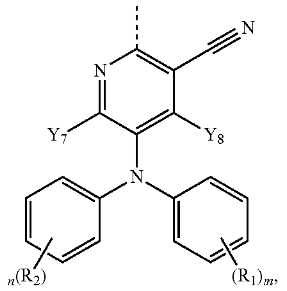

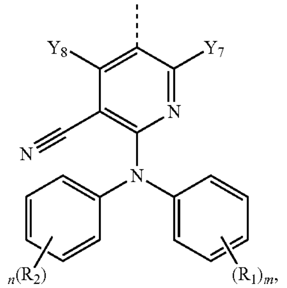

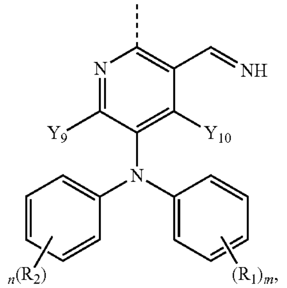

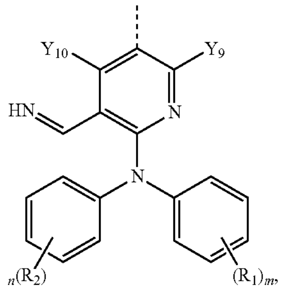

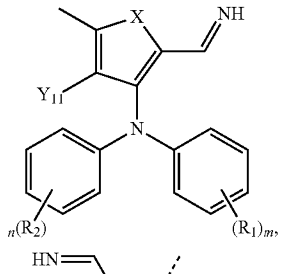

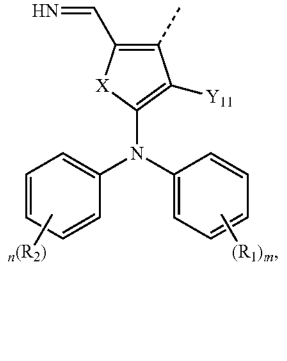

-continued

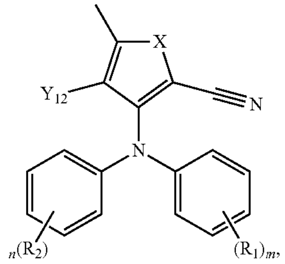

and

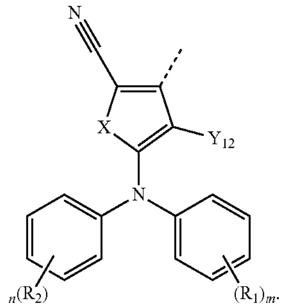

In a case where L is selected from any one of divalent fused aryl and divalent fused heteroaryl, the divalent fused aryl and the divalent fused heteroaryl each have or do not have a substituent. In a case where the divalent fused aryl and the divalent fused heteroaryl each have a substituent, the substituent is selected from any one of deuterium, tert-butyl, phenyl, cyano and methylimino, and a total number of cyano and methylimino is not more than 2.

In a case where L is divalent fused aryl, the divalent fused aryl may be selected from any one of naphthyl, anthryl and phenanthryl. In this case, in an example where the divalent fused aryl is naphthyl, L may be selected from any one of the following formulas:

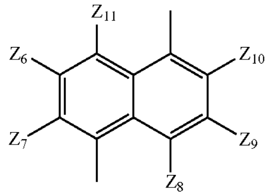

and

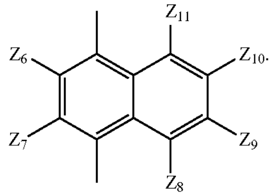

$Z_6$ to $Z_{11}$ are same or different, and are each independently selected from any one of hydrogen, deuterium, tert-butyl, phenyl, cyano and methylimino, and a total number of the cyano and the methylimino is not more than 2 in $Z_6$ to $Z_{11}$.

In this case, the structure of the formula (I) may be expressed as any one shown below.

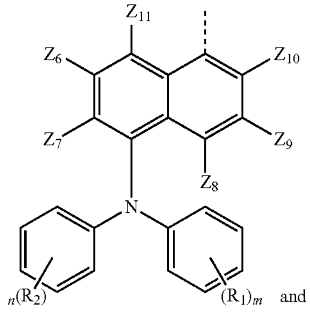

and

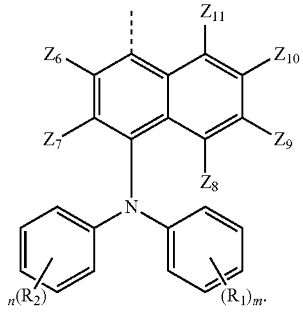

In a case where L is divalent fused heteroaryl, the divalent fused heteroaryl may be selected from any one of quinolinyl, indolyl, and benzothiazolyl. In this case, in an example where divalent fused heteroaryl is selected from quinolinyl or isobenzothiazolyl, L may be selected from any one of the following formulas:

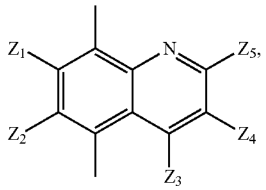

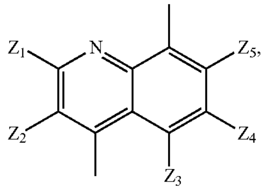

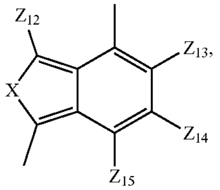

and

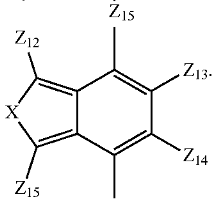

$Z_1$ to $Z_5$ are same or different, $Z_{12}$ to $Z_{15}$ are same or different, and $Z_1$ to $Z_5$ and $Z_{12}$ to $Z_{15}$ are each independently selected from any one of hydrogen, deuterium, tert-butyl, phenyl, cyano and methylimino. Moreover, a total number of the cyano and the methylimino is not more than 2 in $Z_1$ to $Z_5$, a total number of the cyano and the methylimino is not more than 2 in $Z_{12}$ to $Z_{15}$, and X is selected from O, S, NH or N(R).

In this case, the structure of the formula (I) may be expressed as any one shown below.

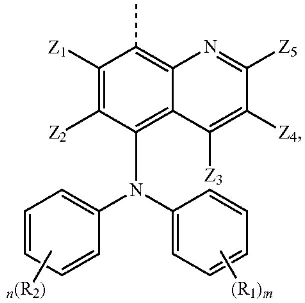

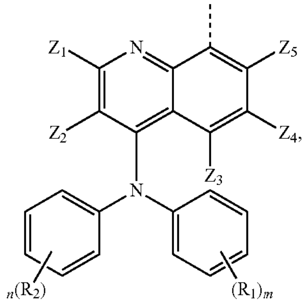

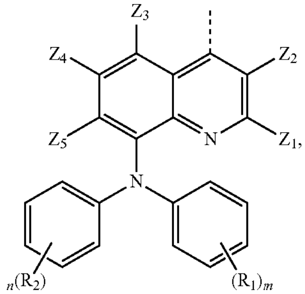

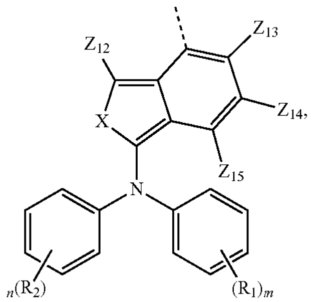

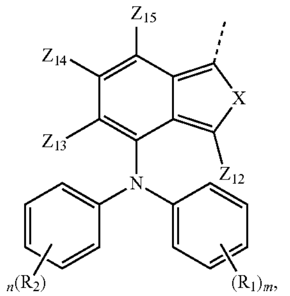

and

-continued

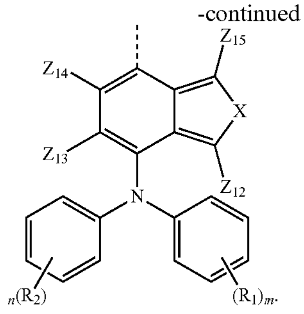

Based on the above structure, the acceptor moiety A is selected from any one of a substituted or unsubstituted fused aromatic ring and a substituted or unsubstituted fused heteroaromatic ring, a number of heteroatoms in the fused heterocyclic ring is not more than 2, and the substituent is R. R, $R_1$ and $R_2$ are same or different, and are each independently selected from any one of deuterium, halogen, cyano, nitro, amino, $C_1$ to $C_{40}$ alkyl, $C_2$ to $C_{40}$ alkenyl, $C_2$ to $C_{40}$ alkynyl, $C_3$ to $C_{40}$ cycloalkyl, $C_3$ to $C_{40}$ heterocycloalkyl, $C_6$ to $C_{60}$ aryl, $C_5$ to $C_{60}$ heteroaryl, $C_1$ to $C_{40}$ alkoxy, $C_6$ to $C_{60}$ aryloxy, $C_3$ to $C_{40}$ alkylsilyl, $C_6$ to $C_{60}$ arylsilyl, $C_1$ to $C_{40}$ alkylboryl, $C_6$ to $C_{60}$ arylboryl, $C_6$ to $C_{60}$ aryl phosphinyl, $C_6$ to $C_{60}$ mono- or diaryl phosphinyl, and $C_6$ to $C_{60}$ arylamine. m and n are each an integer from 0 to 3.

R, $R_1$ and $R_2$ may be each combined with a respective adjacent group to form a condensed ring.

In a case where the acceptor moiety A is selected from the substituted or unsubstituted fused aromatic ring, the acceptor moiety A may be any one selected from naphthalene, anthracene and phenanthrene, and a structural formula of the acceptor moiety A is expressed as follows:

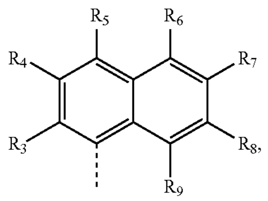

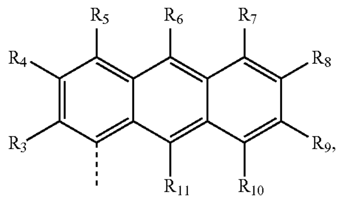

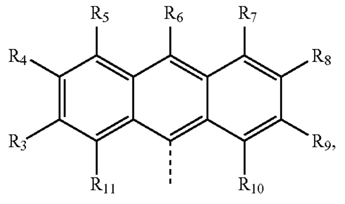

and

-continued

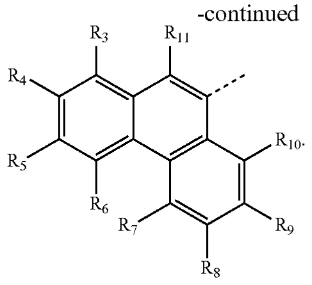

$R_3$ to $R_{11}$ are same or different, and are each independently selected from hydrogen, deuterium, halogen, cyano, nitro, amino, $C_1$ to $C_{40}$ alkyl, $C_2$ to $C_{40}$ alkenyl, $C_2$ to $C_{40}$ alkynyl, $C_3$ to $C_{40}$ cycloalkyl, $C_3$ to $C_{40}$ heterocycloalkyl, $C_6$ to $C_{60}$ aryl, $C_5$ to $C_{60}$ heteroaryl, $C_1$ to $C_{40}$ alkoxy, $C_6$ to $C_{60}$ aryloxy, $C_3$ to $C_{40}$ alkylsilyl, $C_6$ to $C_{60}$ arylsilyl, $C_1$ to $C_{40}$ alkylboryl, $C_6$ to $C_{60}$ arylboryl, $C_6$ to $C_{60}$ aryl phosphinyl, $C_6$ to $C_{60}$ mono- or diaryl phosphinyl, and $C_6$ to $C_{60}$ arylamine.

$R_3$ to $R_{11}$ may be each combined with a respective adjacent group to form a condensed ring.

In this case, a structural formula of the D-A type organic light-emitting material may be expressed as any one shown below.

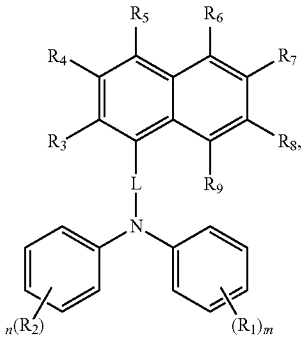

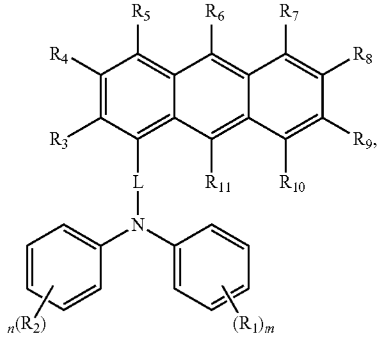

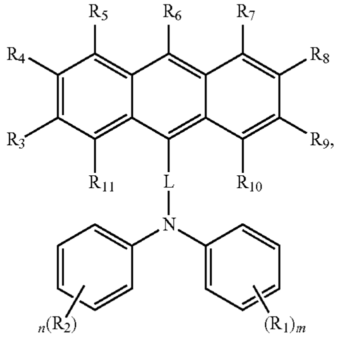

and

-continued

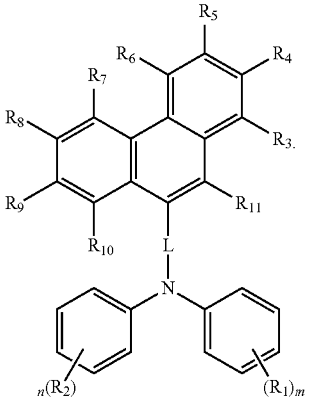

According to the above case where L may be divalent fused heteroaryl, such as quinolinyl, the structural formula of the D-A type organic light-emitting material may be expressed as follows:

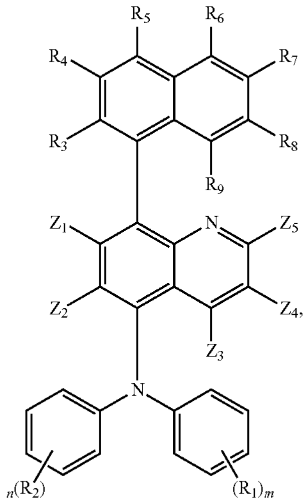

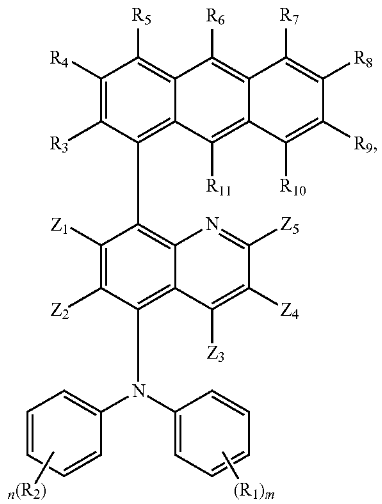

-continued

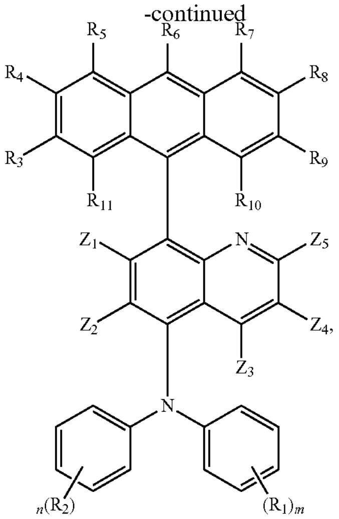

and

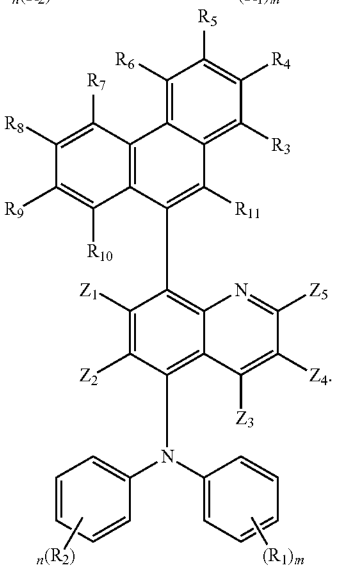

It will be understood that the donor moiety and the acceptor moiety are connected by a dashed line in the formula (I).

$R_3$ to $R_{11}$ are same or different, and are each independently selected from hydrogen, deuterium, halogen, cyano, nitro, amino, $C_1$ to $C_{40}$ alkyl, $C_2$ to $C_{40}$ alkenyl, $C_2$ to $C_{40}$ alkynyl, $C_3$ to $C_{40}$ cycloalkyl, $C_3$ to $C_{40}$ heterocycloalkyl, $C_6$ to $C_{60}$ aryl, $C_5$ to $C_{60}$ heteroaryl, $C_1$ to $C_{40}$ alkoxy, $C_6$ to $C_{60}$ aryloxy, $C_3$ to $C_{40}$ alkylsilyl, $C_6$ to $C_{60}$ arylsilyl, $C_1$ to $C_{40}$ alkylboryl, $C_6$ to $C_{60}$ arylboryl, $C_6$ to $C_{60}$ aryl phosphinyl, $C_6$ to $C_{60}$ mono- or diaryl phosphinyl, and $C_6$ to $C_{60}$ arylamine.

$R_3$ to $R_{11}$ may be each combined with a respective adjacent group to form a condensed ring. It can be seen therefrom that, acceptor moieties of the above structural formulas are not limited to the fused aromatic ring, and may further include a non-benzene aromatic ring, such as a seven-membered aromatic ring, and may even further include an alicyclic ring and a heterocyclic ring. Depending on whether the alicyclic ring is a monocyclic ring or a polycyclic ring, the alicyclic ring may include a small ring having 3 or 4 carbon atoms, a common ring having 5 to 7 carbon atoms, a medium ring having 8 to 11 carbon atoms, a large ring having more than 11 carbon atoms, a linked ring, a spiro ring, and a bridged ring.

Herein, the non-benzene aromatic ring, the alicyclic ring, or the heterocyclic ring may be a condensed ring formed by combining at least one of $R_3$ to $R_{11}$ with an adjacent group.

In a case where the acceptor moiety A is selected from the substituted or unsubstituted fused heteroaromatic ring, the acceptor moiety A may be acridine, and the structural formula of the acceptor moiety A is expressed as follows:

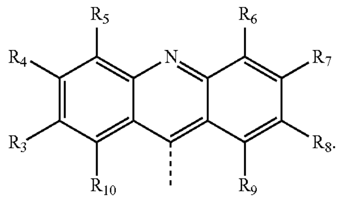

$R_3$ to $R_{10}$ are same or different, and are each independently selected from any one of hydrogen, deuterium, halogen, cyano, nitro, amino, $C_1$ to $C_{40}$ alkyl, $C_2$ to $C_{40}$ alkenyl, $C_2$ to $C_{40}$ alkynyl, $C_3$ to $C_{40}$ cycloalkyl, $C_3$ to $C_{40}$ heterocycloalkyl, $C_6$ to $C_{60}$ aryl, $C_5$ to $C_{60}$ heteroaryl, $C_1$ to $C_{40}$ alkoxy, $C_6$ to $C_{60}$ aryloxy, $C_3$ to $C_{40}$ alkylsilyl, $C_6$ to $C_{60}$ arylsilyl, $C_1$ to $C_{40}$ alkylboryl, $C_6$ to $C_{60}$ arylboryl, $C_6$ to $C_{60}$ aryl phosphinyl, $C_6$ to $C_{60}$ mono- or diaryl phosphinyl, and $C_6$ to $C_{60}$ arylamine.

$R_3$ to $R_{10}$ may be each combined with a respective adjacent group to form a condensed ring.

In this case, the structural formula of the D-A type organic light-emitting material may be expressed as follows:

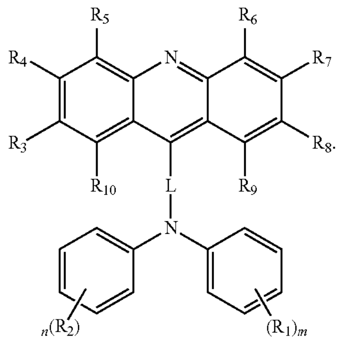

According to the above case where L may be divalent fused heteroaryl, such as quinolinyl, the structural formula of the D-A type organic light-emitting material may be expressed as follows:

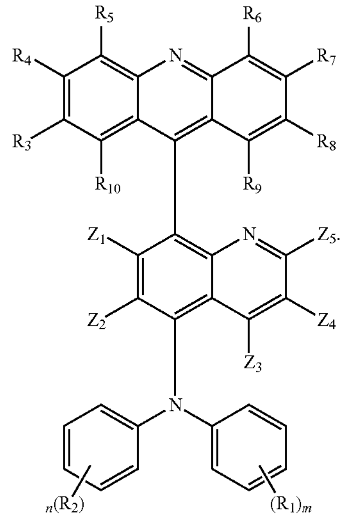

It will be understood that the donor moiety and the acceptor moiety are connected by the dashed line in the formula (I).

$R_3$ to $R_{10}$ are same or different, and are each independently selected from any one of hydrogen, deuterium, halogen, cyano, nitro, amino, $C_1$ to $C_{40}$ alkyl, $C_2$ to $C_{40}$ alkenyl, $C_2$ to $C_{40}$ alkynyl, $C_3$ to $C_{40}$ cycloalkyl, $C_3$ to $C_{40}$ heterocycloalkyl, $C_6$ to $C_{60}$ aryl, $C_5$ to $C_{60}$ heteroaryl, $C_1$ to $C_{40}$ alkoxy, $C_6$ to $C_{60}$ aryloxy, $C_3$ to $C_{40}$ alkylsilyl, $C_6$ to $C_{60}$ arylsilyl, $C_1$ to $C_{40}$ alkylboryl, $C_6$ to $C_{60}$ arylboryl, $C_6$ to $C_{60}$ aryl phosphinyl, $C_6$ to $C_{60}$ mono- or diaryl phosphinyl, and $C_6$ to $C_{60}$ arylamine.

$R_3$ to $R_{10}$ may be each combined with a respective adjacent group to form a condensed ring. It can be seen therefrom that, acceptor moieties of the above structural formulas are also not limited to the fused heteroaromatic ring, and may further include non-benzene aromatic hydrocarbon, an alicyclic ring, and a heterocyclic ring. For specific structures of non-benzene aromatic hydrocarbon and the alicyclic ring herein, reference may be made to the above related description of non-benzene aromatic hydrocarbon and the alicyclic ring.

By absorbing energy in a certain form, organic molecules in a ground state S0 are excited to a higher energy quantum state, which is referred to as an excited state. The excited state is classified into two types according to spin modes of electrons. In a case where spin directions of the electrons in the ground state and the excited state remain consistent during transition (spin directions of two electrons being opposite), the spin quantum number is 0, the spin multiplicity is 1, and such an excited state is referred to as a singlet state. In a case where spins of the electrons in the ground state and the excited state change during the transition (spin directions of two electrons being same), the spin quantum number is 1, the spin multiplicity is 3, and such an excited state is referred to as a triplet state. Depending on magnitude of the energy absorbed, excited states to which the molecules are excited are also different. When the molecules absorb high energy, the molecules are excited to a high energy excited state. However, the high energy excited state has a very short lifetime, and the molecules are easy to return to the lowest excited state S1 or T1 through internal conversion. In other words, photophysical and photochemical reactions generally occur in the S1 state and the T1 state, which is usually referred to as the Kasha rule.

The molecules in the excited state are very unstable relative to in the ground state, and are inactivated in various ways to return to the ground state. An inactivation process in the excited state is mainly classified into physical inactivation and chemical inactivation. In a photoelectric material system, the chemical inactivation is rare, while the physical inactivation is common and unavoidable. The molecules in the excited state may be inactivated through interactions, such as intermolecular energy transfer or intermolecular electron transfer, and may also be inactivated through an intermolecular radiative transition process or a non-radiative transition process.

When the light-emitting molecules are in the excited state, they may return to the ground state by means of radiative transition. In a case where before and after the radiative transition, an electronic configuration does not change, that is, the transition process does not involve the spin-flip of the electrons, light emitted in this case is referred to as fluorescent light, such as light generated when the molecules in the S1 state returns to the S0 state by means of the radiative transition. In a case where the electron configuration changes before and after the radiative transition, that is, the spin direction of the electrons is reversed during the transition, light emitted in this case is referred to as phosphorescent light, such as light generated when the molecules in the T1 state transitions to the S0 state. Normally, the spin-flip of the electrons is very difficult, and thus it is difficult to observe phosphorescent light in a general molecular system. The non-radiative transition process usually refers to a process in which the molecules in the excited state are not inactivated by means of radiation light, and mainly includes an internal conversion process between same configurations (e.g., a transition from S2 to S1) and an intersystem crossing process between different configurations (e.g., a transition between T1 and S1). As mentioned above, the intersystem crossing process involves the spin-flip of the electrons. Therefore, in a general system, this process is much slower than the internal conversion process, and it is generally considered that the intersystem crossing process cannot compete with the internal conversion process.

The transition of the excited state of the organic molecules may be simply understood as a process in which electrons in the molecules transition from an occupied orbital to a non-occupied orbital. Then, after the transition, an original orbital where the electrons are located becomes an empty orbital, i.e., a hole orbital, and the non-occupied orbital where the electrons are located may be referred to as an electronic orbital. According to distribution positions of the hole orbital and electron orbital of the molecules before and after the transition, the excited state of the organic molecules is classified into two types. An excited state where the distribution positions of the electrons and the holes before and after the transition are substantially same is referred to as a locally excited (LE) state, which often appears in compounds having conjugated macromolecules, such as naphthalene and anthracene. On the contrary, an excited state where the electrons and the holes are distributed on different fragments of the molecules or different molecules before and after the transition is referred to as a charge-transfer (CT) excited state, which often appears in organic compounds having molecules in which the donor and the receptor are connected, such as molecules of the D-A type organic material.

The LE state widely exists in molecules of organic compounds. Since the distribution positions of the electrons and the holes in the excited state are substantially same after the molecules are excited, binding energy of an exciton formed by an electron-hole pair is very large, and the exciton is referred to as Frenkel exciton. According to the Coulomb interaction formula, interaction between positive and negative charges is inversely proportional to a square of a radius. Therefore, this type of exciton has a large binding energy, and the electron-hole pair is not easily separated. As a result, molecules in the excited state are easy to be inactivated to return to the ground state by means of radiation photons, and molecules mainly in the LE state generally have a high radiative transition rate and a high photoluminescent efficiency. Moreover, the large binding energy of the exciton also affects the spin-flip of the electron, and thus it is generally considered that the intersystem crossing process is difficult to occur in the LE state itself, which also leads to a phenomenon of low exciton utilization rate of the organic molecules whose excited state is mainly the LE state.

As mentioned above, the CT state is an excited state in which the electrons and the holes are distributed on different segments of the system, and excitons formed in this case are referred to as charge transfer excitons. This type of excitons has small exciton binding energy due to a long distance between electrons and holes. The small binding energy enables more freedom of the electrons and larger possibility of occurrence of the intersystem crossing, and ensures the exciton utilization rate of the material. In addition, the far distributions of the electrons and the holes lead to lack of effective orbital coupling in the transition of the electrons, and a transition moment is usually small, which restricts the photoluminescent efficiency of the molecules. Moreover, due to the weak binding energy, a lifetime of the CT state is longer than that of the LE state, triplet-triplet annihilation (TTA) is easy to occur between CT states of triplet states, and a device design should be more cautious to prevent roll-off of the efficiency of the material at a high current density. According to different distribution positions of the electrons and the holes, the excited state is generally classified into an intramolecular charge transfer (ICT) state and an intermolecular charge transfer state. Compared with the ICT state, the intermolecular CT state has a longer lifetime, the distributions of the electrons and the holes are more delocalized, a recombination process is more difficult to occur, and is not suitable for a light-emitting application. The CT state often appears in a donor-acceptor molecular system. There are numerous factors that affect characteristics of the CT state, such as abilities of the donor and the acceptor, a distance between the donor and the acceptor, and a relative position of the donor and the acceptor. A dipole moment of the CT state is usually large, and the CT state is more stable due to influence of a polar field, and thus is very sensitive to a polarity of a solvent. Generally, as the polarity of the solvent increases, emission of the CT state is red-shifted, a spectrum is broadened, and a radiation intensity is reduced, which is referred to as a solvatochromic effect of the CT state. The solvatochromic effect is an effective way to determine whether the system includes the CT state.

From the above characteristics of the LE state and the CT state, it can be known that, a radiative transition ability and the exciton utilization rate in the molecular system are mutually restricted. Therefore, by adjusting a ratio between the characteristics of the LE state and the characteristics of the CT state in the molecules, an excited state having both the characteristics of the LE state and charge transfer characteristics may be designed. The characteristics of the LE state ensure radiation efficiency, and the characteristics of the CT state ensure the exciton utilization rate, and then the electroluminescent material with such excited state is undoubtedly the most potential.

Figure 3A:
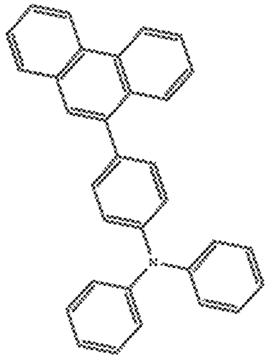
FIG. 3A illustrates a table, in which molecular structures of a D-A type organic light-emitting material having a donor moiety as a triphenylamine group in a comparative example, and the D-A type organic light-emitting material modified based on a linking group between the donor moiety and the acceptor moiety in some embodiments, and frontier orbital distributions of excited states corresponding thereto are shown.
Figure 3A:
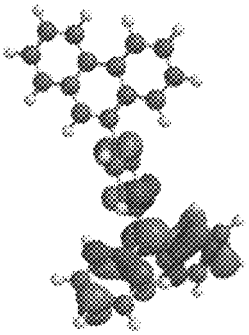
Figure 3A:
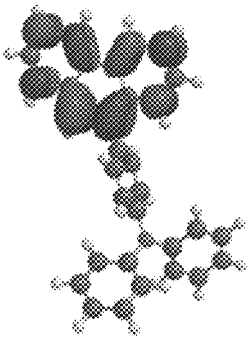
Figure 3A:
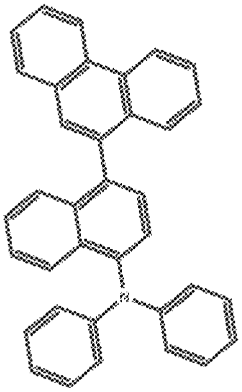
Figure 3A:
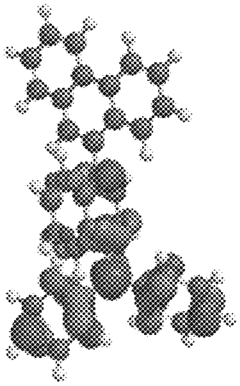
Figure 3A:
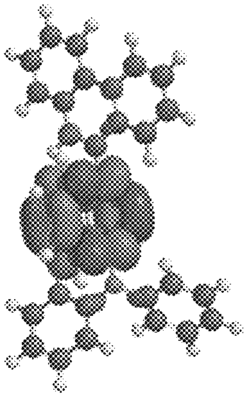
Figure 3A:
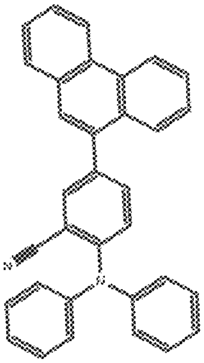
Figure 3A:
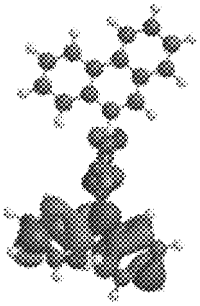
Figure 3A:
Figure 3B:
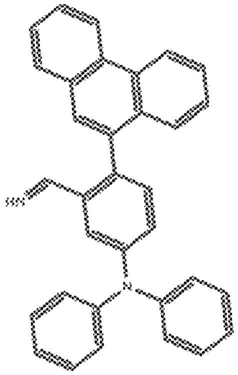
FIG. 3B illustrates another table, in which molecular structures of the D-A type organic light-emitting material modified based on a linking group between the donor moiety and the acceptor moiety in some embodiments, and frontier orbital distributions of excited states corresponding thereto are shown.
Figure 3B:
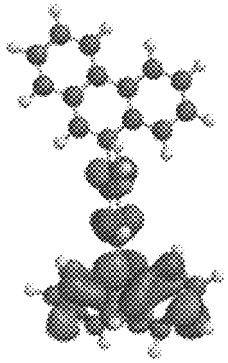
Figure 3B:
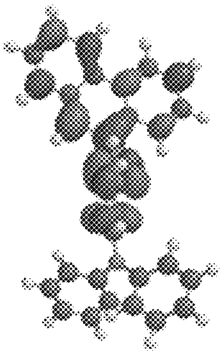
Figure 3B:
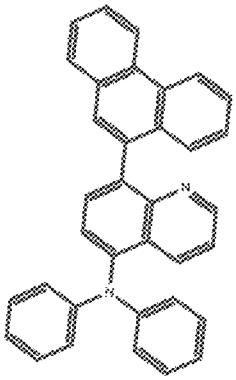
Figure 3B:
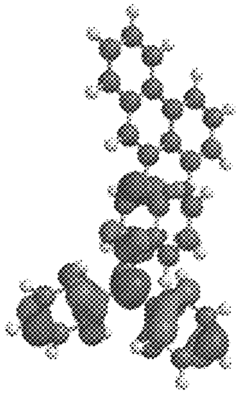
Figure 3B:
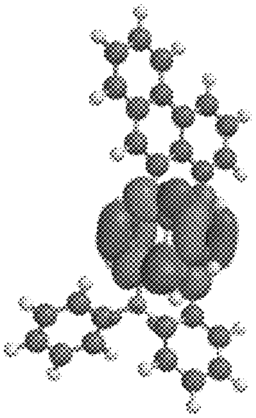
Figure 3B:
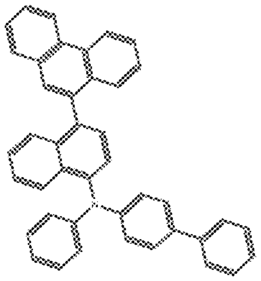
Figure 3B:
Figure 3B:
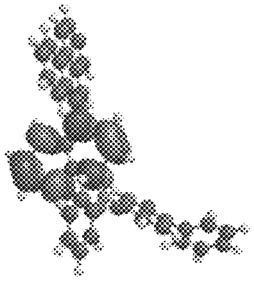

In the D-A type organic light-emitting material provided by the embodiments of the present disclosure, by simulating orbital distributions of the D-A type organic light-emitting material, models of the highest occupied molecular orbital (HOMO) and the lowest unoccupied molecular orbital (LUMO) distributions of the D-A type organic light-emitting material may be obtained. As shown in the following Table 1a in FIG. 3A and Table 1b in FIG. 3B, molecular structures of a D-A type organic light-emitting material having a donor moiety as a triphenylamine group in the comparative example shown in FIG. 3A, and the D-A type organic light-emitting material modified based on a linking group between the donor moiety and the acceptor moiety in the embodiments (i.e., the embodiments 1 and 2 shown in FIG. 3A, and the embodiments 3, 4 and 5 shown in FIG. 3B) of the present disclosure, and frontier orbital distributions of excited states corresponding thereto are shown. As can be seen from the Table 1a in FIG. 3A and Table 1b in FIG. 3B, the comparative example is provided where the donor moiety is the triphenylamine group, HOMO and LUMO are respectively localized on the donor moiety and the acceptor moiety, and the frontier orbitals of the D-A type organic light-emitting material hardly overlap, that is, the CT state of this D-A type organic light-emitting material is strong. Compared with the comparative example, by selecting a fused aromatic ring or an aromatic ring containing a cyano substituent to replace an aromatic ring structure to modify a linking position between the donor moiety and the acceptor moiety and to construct an appropriate donor-acceptor group, it is possible to make the frontier orbitals of the D-A type organic light-emitting material have both an overlapping portion and a separate portion, which belongs to a hybridized local and charge-transfer (HLCT) state. The hybridized excited state is different from a pure LE state and a pure CT state, and based on ensuring the charge transfer characteristic of the excited state, molecular conjugation is appropriately increased, an overlapping area of the electrons and the holes is enlarged, that is, an appropriate number of components in the LE state are introduced, so that not only the high photoluminescent efficiency is satisfied, but also the exciton utilization rate is ensured. As a result, it is possible to avoid problems of strong CT state, small extent of overlapping, low fluorescent quantum yield and reddish chromaticity of a pure thermally activated delayed fluorescence (TADF) material.

In some embodiments, a twist angle between the donor moiety and the acceptor moiety of the D-A type organic light-emitting material is found through simulation to be 35 degrees to 80 degrees. According to research findings, if the twist angle is excessively large (e.g., 90°), the pure CT state or the pure LE state will be generated, and coupling between the LE state and the CT state is severely suppressed due to approximately orthogonal orbitals. Conversely, if the twist angle is excessively small (e.g., 0°), the molecules of the entire D-A type organic light-emitting material will be conjugated, resulting in disappearance of CT conversion. Therefore, an appropriate twist angle is of great significance for maintaining a coupling state between the CT state and the LE state. Moreover, the twist angle between the donor moiety and the acceptor moiety of the D-A type organic light-emitting material is in a range of 35 degrees to 80 degrees, inclusive, which also proves that the excited state of the D-A type organic light-emitting material is between the pure LE state and the pure CT state, and the intramolecular charge-transfer (CT) excited state and the locally excited (LE) state coexist in a hybridized way.

In order to further improve stability of HLCT of the D-A type organic light-emitting material, for example, the twist angle between the donor moiety D and the acceptor moiety A of the D-A type organic light-emitting material is in the range of 35 degrees to 80 degrees, inclusive.

In some embodiments, from a simulation analysis of the inactivation process of the excited state, it may be concluded that in the D-A type organic light-emitting material, excitons in the triplet state (TN) and excitons in the singlet state (SM) are in the following relationship:

$$|TN-SM|\leq 0.2\text{ eV}.$$

M is an integer greater than or equal to 1, and N is an integer greater than M.

That is, the D-A type organic light-emitting material may undergo reverse intersystem crossing from a "high-order" triplet state to the singlet state, so that the D-A type organic light-emitting material (i.e., one type of fluorescent material) may effectively utilize the excitons in the triplet state, and quenching of the excitons in the triplet state may be significantly reduced.

In some embodiments, a radiation decay time of the D-A type organic light-emitting material is less than 30 ns. That is, a photoluminescent emission light emitted by the D-A type organic light-emitting material is fluorescent light, and the quenching of the excitons in the triplet state may be reduced.

In some other embodiments, by simulating the excited state through functional method and through calculation, it may be obtained that as a polarity of a solvent gradually increases, a wavelength corresponding to a peak of an emission spectrum of the D-A type organic light-emitting material gradually increases. This indicates that the CT state is present in the excited state of the D-A type organic light-emitting material, which further proves that the D-A type organic light-emitting material has the characteristics of HLCT.

Some embodiments of the present disclosure provide an application of the D-A type organic light-emitting material in an organic electronic device.

The organic electronic device herein may be an organic light-emitting diode (OLED), an organic photovoltaic cell, an organic light-emitting cell, an organic field effect transistor, an organic light-emitting field effect transistor, an organic laser, an organic spintronic device, an organic sensor, an organic plasmon emitting diode, or the like.

In some embodiments, the D-A type organic light-emitting material is used for a light-emitting layer of an OLED device. In this case, the D-A type organic light-emitting material may be doped into a host material as a guest material, and the light-emitting layer may be formed through an evaporation process or an inkjet printing process.

In some embodiments, a mass ratio of the D-A type organic light-emitting material in the light-emitting layer is in a range of 0.5% to 10%, inclusive.

Some embodiments of the present disclosure provide a method for manufacturing the D-A type organic light-emitting material. The D-A type organic light-emitting material may be manufactured by using different synthetic routes depending on different raw materials, and the manufacturing routes of the D-A type organic light-emitting material are not specifically limited herein.

Herein, in a case where L in the D-A type organic light-emitting material is determined, there are two possible manufacturing methods.

In a first manufacturing method, a first compound (i) is synthesized first, and then the first compound (i) is used as a reaction raw material to synthesize the D-A type organic light-emitting material.

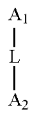

(i)

In the compound (i), L is selected from any one of divalent aryl, divalent heteroaryl, divalent fused aryl and divalent fused heteroaryl.

$A_1$ is selected from any one of the fused aromatic ring and the fused heteroaromatic ring, and $A_2$ is selected from any one of halogen. In a case where L is selected from any one of divalent aryl and divalent heteroaryl, the divalent aryl and the divalent heteroaryl each have one or more substituents each independently selected from any one of deuterium, tert-butyl, phenyl, cyano and methylimino, and at least one substituent is selected from any one of cyano and methylimino, and a total number of the cyano and the methylimino is not more than 2.

The fused aromatic ring or the fused heteroaromatic ring has or does not has a substituent. In a case where the fused aromatic ring or the fused heteroaromatic ring has a substituent, the substituent is R. R is selected from any one of deuterium, halogen, cyano, nitro, amino, $C_1$ to $C_{40}$ alkyl, $C_2$ to $C_{40}$ alkenyl, $C_2$ to $C_{40}$ alkynyl, $C_3$ to $C_{40}$ cycloalkyl, $C_3$ to $C_{40}$ heterocycloalkyl, $C_6$ to $C_{60}$ aryl, $C_5$ to $C_{60}$ heteroaryl, $C_1$ to $C_{40}$ alkoxy, $C_6$ to $C_{60}$ aryloxy, $C_3$ to $C_{40}$ alkylsilyl, $C_6$ to $C_{60}$ arylsilyl, $C_1$ to $C_{40}$ alkylboryl, $C_6$ to $C_{60}$ arylboryl, $C_6$ to $C_{60}$ aryl phosphinyl, $C_6$ to $C_{60}$ mono- or diaryl phosphinyl, and $C_6$ to $C_{60}$ arylamine.

R may be combined with an adjacent group to form a condensed ring.

According to that $A_1$ is selected from any one of the fused aromatic ring and the fused heteroaromatic ring, and L is selected from any one of divalent aryl, divalent heteroaryl, divalent fused aryl and divalent fused heteroaryl, it can be known that $A_1$ and L may be linked together through a coupling reaction.

Herein, in an example where $A_1$ is phenanthrene and L is aryl containing cyano, $A_1$ and L may be linked together through a Suzuki coupling, and a reaction equation may be shown as follows:

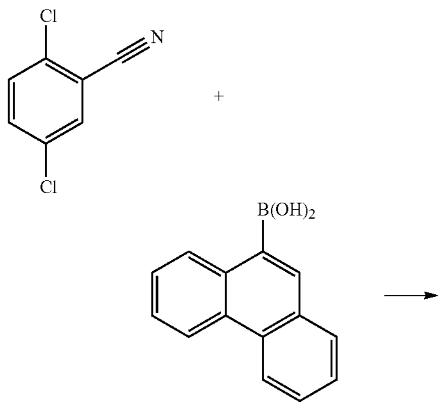

-continued

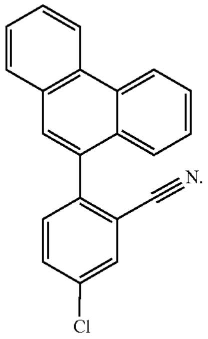

After the first compound (i) is generated, the D-A type organic light-emitting material may be obtained by using the first compound (i) as the reaction raw material and subjecting the first compound (i) to a substitution reaction with a compound of the following structural formula:

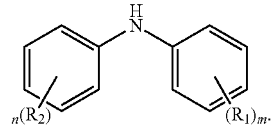

A specific equation is shown as follows:

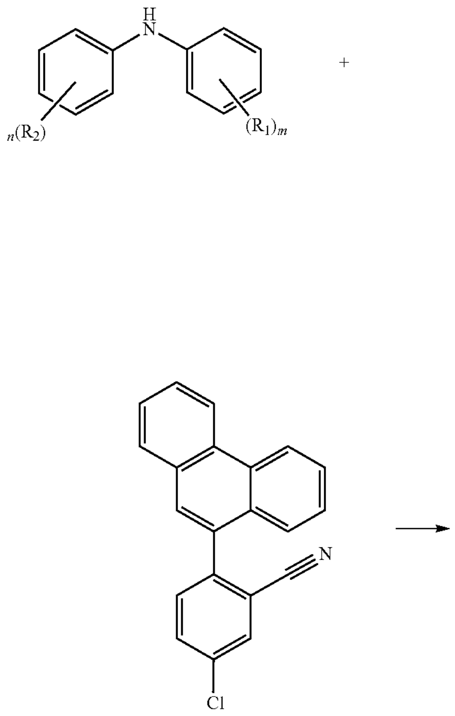

-continued

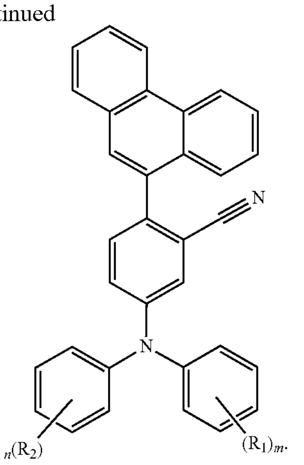

In a second manufacturing method, a second compound (ii) is synthesized first, and then the second compound (ii) is used as a reaction raw material to synthesize the D-A type organic light-emitting material.

(ii)

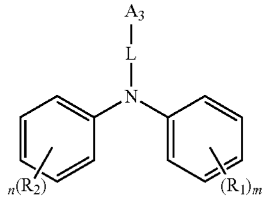

In the compound (ii), m and n are each an integer from 0 to 3, $R_1$ and $R_2$ are same or different, and are each independently selected from any one of deuterium, halogen, cyano, nitro, amino, $C_1$ to $C_{40}$ alkyl, $C_2$ to $C_{40}$ alkenyl, $C_2$ to $C_{40}$ alkynyl, $C_3$ to $C_{40}$ cycloalkyl, $C_3$ to $C_{40}$ heterocycloalkyl, $C_6$ to $C_{60}$ aryl, $C_5$ to $C_{60}$ heteroaryl, $C_1$ to $C_{40}$ alkoxy, $C_6$ to $C_{60}$ aryloxy, $C_3$ to $C_{40}$ alkylsilyl, $C_6$ to $C_{60}$ arylsilyl, $C_1$ to $C_{40}$ alkylboryl, $C_6$ to $C_{60}$ arylboryl, $C_6$ to $C_{60}$ aryl phosphinyl, $C_6$ to $C_{60}$ mono- or diaryl phosphinyl, and $C_6$ to $C_{60}$ arylamine.

$R_1$ and $R_2$ may be each combined with a respective adjacent group to form a condensed ring.

According to that L may be phenethyl cyanide, and the fused aromatic ring is phenanthrene, $A_3$ may be selected from any one of halogen and boronic acid. In a case where $A_3$ is selected from halogen, such as Cl, a structural formula of a compound to be reacted with the second compound (ii) may be shown as follows:

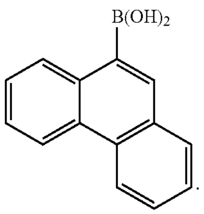 [SMILES: OB(O)c1cc2ccccc2c2ccccc12]

In this case, the second compound (ii) may be used as the reaction raw material to synthesize the D-A type organic light-emitting material through the Suzuki coupling, and a specific equation is shown as follows:

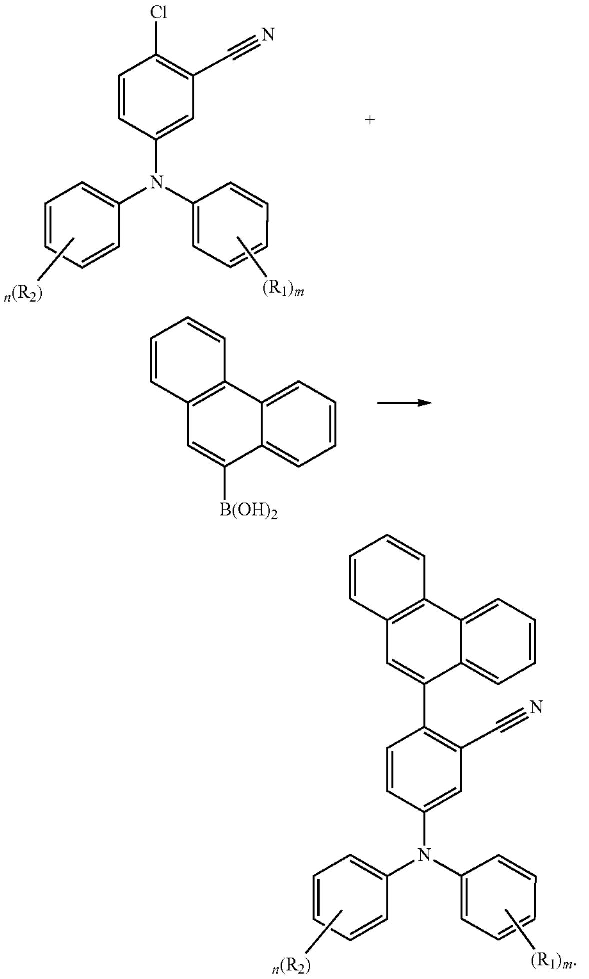

An equation for the synthesis of the second compound (ii) may be shown as follows:

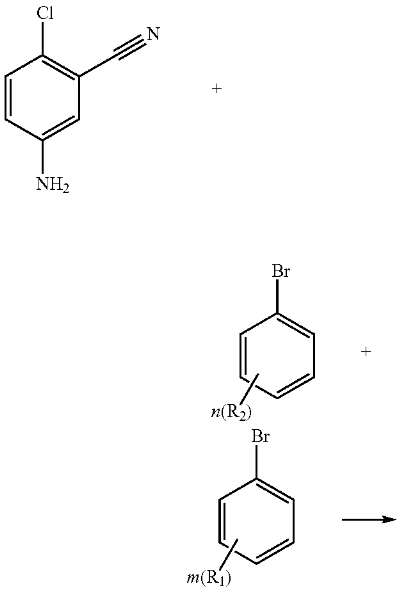

-continued

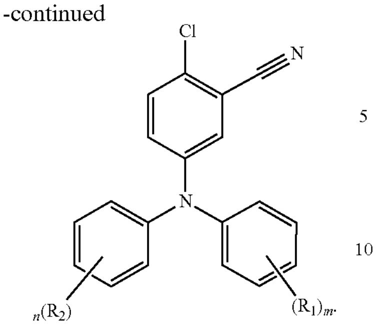

In the above reaction equation, an example in which L contains cyano is shown. A person skilled in the art can understand that, compounds having different substituents may be obtained through purchase or synthesis as desired, and in a case where a compound having a certain substituent of L cannot be purchased, the substituent may be obtained by designing a reaction route for synthesis. Herein, in an example where L contains an azomethine group, the azomethine group may be obtained by using azomethine and aryl chloride as reaction raw materials for reaction. This reaction step may occur after all the above reactions are completed or before all the reactions are started.

In order to objectively evaluate technical effects of the embodiments of the present disclosure, hereinafter, the technical solutions provided by the present disclosure will be exemplarily described in detail through synthesis examples, experimental examples and an application example as follows.

Synthesis Example 1

Synthesis of compound 1 includes the following steps.

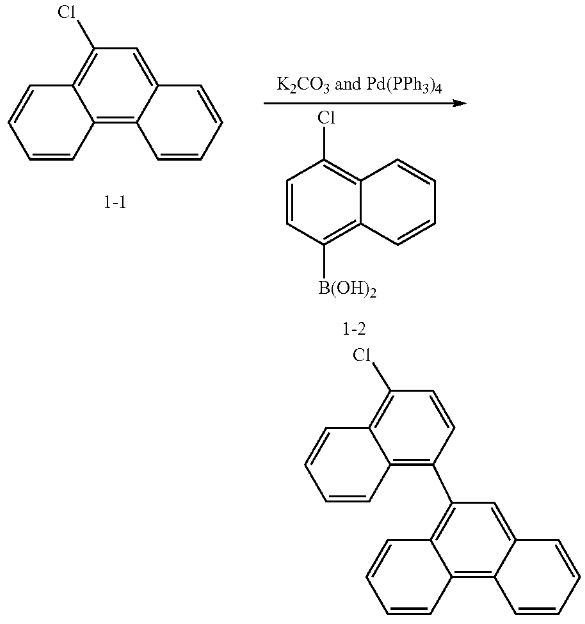

1-1

1-2

1-3

In step 1), the compound 1-1, the compound 1-2, $K_2CO_3$ and $Pd(PPh_3)_4$ are added in a mixed solution of dimethyl ether (DME) and water to form a reaction mixture, and the reaction mixture is refluxed for approximately 12 hours under protection of nitrogen. After the reaction mixture is cooled to a room temperature (approximately 22° C.), the reaction mixture is filtered through a silica gel plug. An organic layer is separated, washed with water, and then dried with $Na_2SO_4$. After evaporation of a solvent, a crude product is purified through column chromatography of silica gel, and is eluted with a mixed solvent of heptane and dichloromethane (a volume ratio of the heptane to the dichloromethane being in a range of 9/1 to 7/3, inclusive) as an eluent to obtain the compound 1-3.

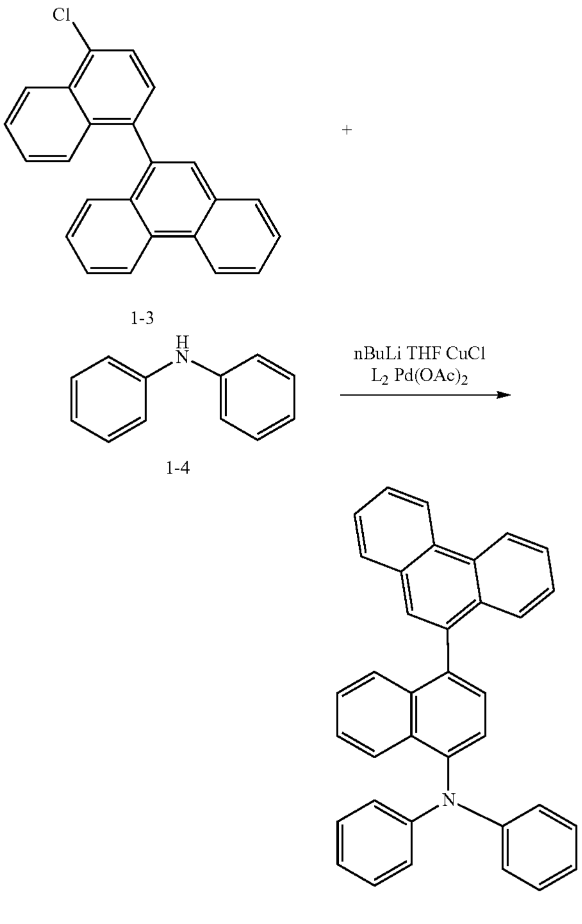

1-3

1-4

In step 2), the compound 1-4 is added into a three-neck flask, and nitrogen is introduced, and then a certain amount of tetrahydrofuran is added. After the solution in the three-neck flask is cooled to −80° C., an n-butyl lithium ethane solution is slowly dripped and stirred. Then, a cuprous chloride solution and certain amounts of palladium acetate, trimethoxy triphenylphosphine and the compound 1-3 that are dissolved in tetrahydrofuran are added and stirred at the room temperature, and then water and chloroform are added for extraction. The separated organic layer is dried, subjected to column chromatography, and recrystallized to obtain the compound 1.

Nuclear magnetic resonance (NMR) ($^{13}C$-NMR) data of the compound 1 is: 145.9 (d), 140.9 (s), 134.2 (s), 133.7 (d), 131.9 (s), 130.3 (s), 129.6 (m), 128.5 (m), 126.6 (m), 125.7 (m), 125.2 (m), 122.4 (d), 121.0 (s), 120.1 (s), 119.6 (s), and 109.8 (s).

Synthesis Example 2

Synthesis of compound 2 includes the following steps.

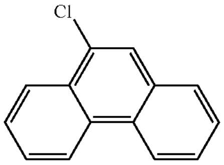

1-1

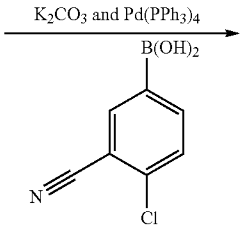

2-2

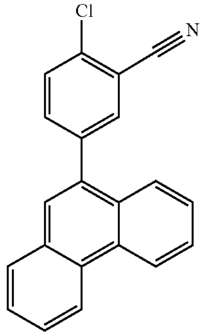

2-3

In step 1), the compound 1-1, the compound 2-2, $K_2CO_3$ and $Pd(PPh_3)_4$ are added in a mixed solution of dimethyl ether (DME) and water to form a reaction mixture, and the reaction mixture is refluxed for approximately 12 hours under protection of nitrogen. After the reaction mixture is cooled to a room temperature (approximately 22° C.), the reaction mixture is filtered through a silica gel plug. An organic layer is separated, washed with water, and then dried with $Na_2SO_4$. After evaporation of a solvent, a crude product is purified through column chromatography of silica gel, and is eluted with a mixed solvent of heptane and dichloromethane (a volume ratio of the heptane to the dichloromethane being in a range of 9/1 to 7/3, inclusive) as an eluent to obtain the compound 2-3.

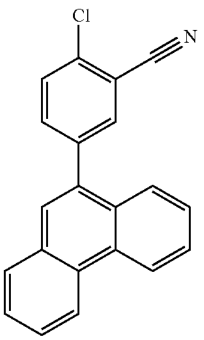

2-3

+

-continued

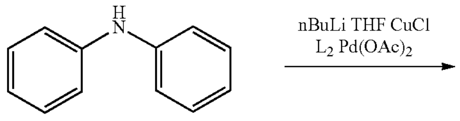

1-4

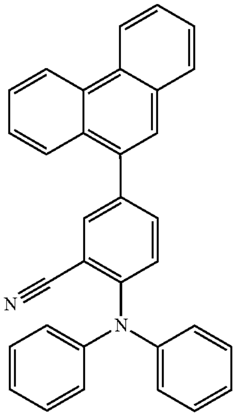

In step 2), the compound 1-4 is added into a three-neck flask, and nitrogen is introduced, and then a certain amount of tetrahydrofuran is added. After the solution in the three-neck flask is cooled to −80° C., an n-butyllithium ethane solution is slowly dripped and stirred. Then, a cuprous chloride solution and certain amounts of palladium acetate, trimethoxy triphenylphosphine and the compound 2-3 that are dissolved in tetrahydrofuran are added and stirred at the room temperature, and then water and chloroform are added for extraction. The separated organic layer is dried, subjected to column chromatography, and recrystallized to obtain the compound 2.

Nuclear magnetic resonance (NMR) ($^{13}$C-NMR) data of the compound 2 is: 145.9 (d), 144.0 (s), 139.3 (s), 133.8 (s), 133.1 (s), 132.3 (s), 131.9 (d), 130.3 (s), 129.6 (m), 128.3 (m), 126.6 (m), 125.7 (m), 123.9 (s), 122.4 (d), 119.6 (s), 117.8 (s), and 105.3 (s).

Synthesis Example 3

Synthesis of compound 3 includes the following steps.

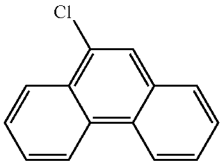

1-1

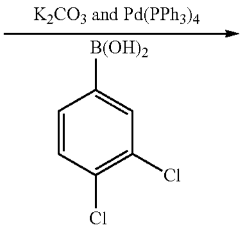

3-2

-continued

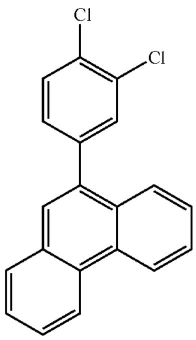

3-3

In step 1), the compound 1-1, the compound 3-2, $K_2CO_3$ and $Pd(PPh_3)_4$ are added in a mixed solution of dimethyl ether (DME) and water to form a reaction mixture, and the reaction mixture is refluxed for approximately 12 hours under protection of nitrogen. After the refluxed product is cooled to a room temperature (approximately 22° C.), the reaction mixture is filtered through a silica gel plug. An organic layer is separated, washed with water, and then dried with $Na_2SO_4$. After evaporation of a solvent, a crude product is purified through column chromatography of silica gel, and is eluted with a mixed solvent of heptane and dichloromethane (a volume ratio of the heptane to the dichloromethane being in a range of 9/1 to 7/3, inclusive) as an eluent to obtain the compound 3-3.

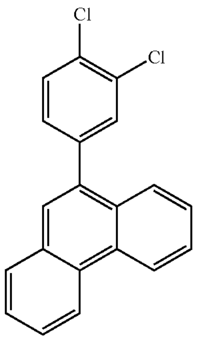

3-3

+

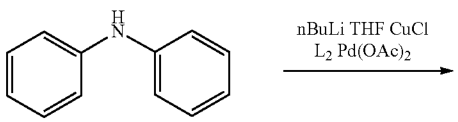

1-4

-continued

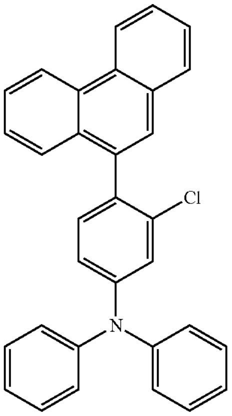

3-5

In step 2), the compound 1-4 is added into a three-neck flask, nitrogen is introduced, and then a certain amount of tetrahydrofuran is added. After the solution in the three-neck flask is cooled to −80° C., an n-butyllithium ethane solution is slowly dripped and stirred. Then, a cuprous chloride solution and certain amounts of palladium acetate, trimethoxy triphenylphosphine and the compound 3-3 that are dissolved in tetrahydrofuran are added and stirred at the room temperature, and then water and chloroform are added for extraction. The separated organic layer is dried, subjected to column chromatography, and recrystallized to obtain the compound 3-5.

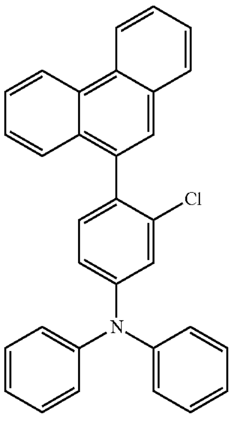

3-5

+

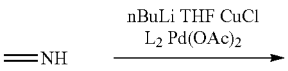

3-6

-continued

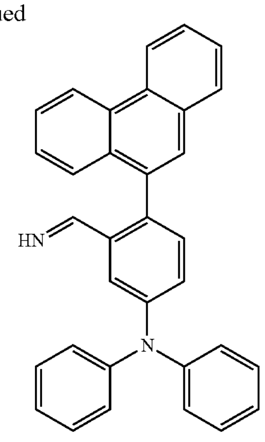

In step 3), the compound 3-6 is added into the three-neck flask, nitrogen is introduced, and then a certain amount of tetrahydrofuran is added. After the solution in the three-neck flask is cooled to −80° C., an n-butyllithium ethane solution is slowly dripped and stirred. Then, a cuprous chloride solution and certain amounts of palladium acetate, trimethoxy triphenylphosphine and 3-5 that are dissolved in tetrahydrofuran are added and stirred at the room temperature, and then water and chloroform are added for extraction. The separated organic layer is dried, subjected to the column chromatography, and recrystallized to obtain the compound 3.

Nuclear magnetic resonance (NMR) ($^{13}$C-NMR) data of the compound 3 is: 163.7 (s), 145.9 (d), 139.5 (s), 136.6 (s), 133.8 (s), 132.3 (d), 131.9 (s), 130.9 (d), 130.3 (s), 129.6 (m), 128.5 (m), 126.6 (m), 125.7 (m), 122.4 (d), 121.1 (s), and 119.6 (s).

Synthesis Example 4

Synthesis of compound 4 includes the following steps.

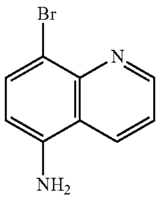

4-1

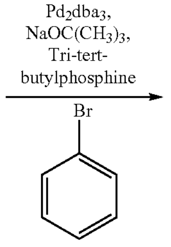

4-2

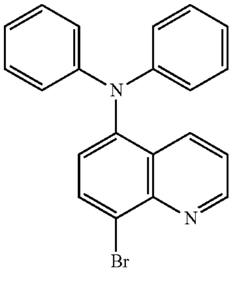

4-3

In step 1), the compound 4-1, the compound 4-2, $Pd_2dba_3$ and sodium tert-butoxide ($NaOC(CH_3)_3$), a toluene solution of tri-tert-butylphosphine are added in a sealed tube, and the tube is sealed. The mixture is heated at 110° C. for 18 hours. After the mixture is cooled to a room temperature, the solvent is removed under reduced pressure, and then dichloromethane is added, and the organic layer is washed twice with water and brine. The product is purified to obtain the compound 4-3.

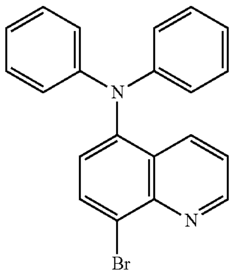

4-3

+

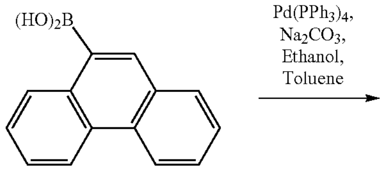

4-4

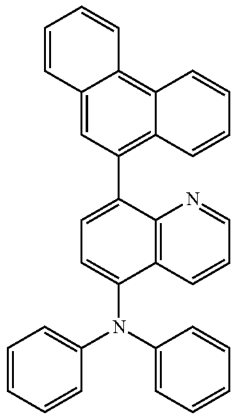

In step 2), the compound 4-3, the compound 4-4, $Pd(PPh_3)_4$, $Na_2CO_3$ aqueous solution, ethanol and toluene are mixed in a flask. The mixture is degassed, and is refluxed for 24 hours at 100° C. under nitrogen. After cooling, the solvent is evaporated in vacuo, and the product is extracted with dichloromethane ($CH_2Cl_2$) and dried with $MgSO_4$. The solvent is evaporated and separated to obtain the compound 4.

Nuclear magnetic resonance (NMR) ($^{13}$C-NMR) data of the compound 4 is: 149.6 (s), 147.1 (s), 145.9 (d), 140.5 (s), 134.2 (s), 133.8 (s), 131.9 (s), 131.1 (s), 130.3 (s), 129.6 (m), 129.1 (s), 128.5 (d), 127.0 (s), 126.6 (m), 125.7 (m), 122.4 (m), 120.2 (s), 119.6 (s), and 116.7 (s).

Synthesis Example 5

Synthesis of compound 5 includes the following steps.

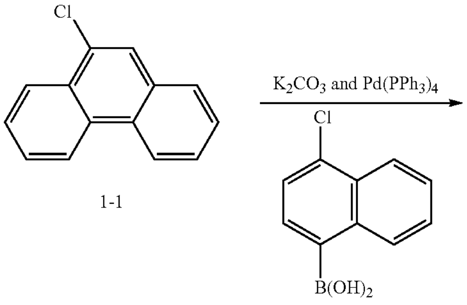

1-1

1-2

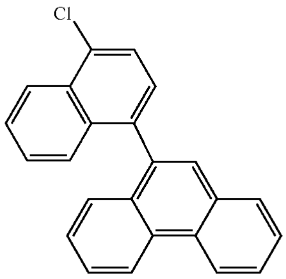

1-3

In step 1), the compound 1-1, the compound 1-2, $K_2CO_3$ and $Pd(PPh_3)_4$ are added in a mixed solution of dimethyl ether (DME) and water to form a reaction mixture, and the reaction mixture is refluxed for approximately 12 hours under protection of nitrogen. After the refluxed product is cooled to a room temperature (approximately 22° C.), the reaction mixture is filtered through a silica gel plug. An organic layer is separated, washed with water, and then dried with $Na_2SO_4$. After evaporation of a solvent, a crude product is purified through column chromatography of silica gel, and is eluted with a mixed solvent of heptane and dichloromethane (a volume ratio of the heptane to the dichloromethane being in a range of 9/1 to 7/3, inclusive) as an eluent to obtain the compound 1-3.

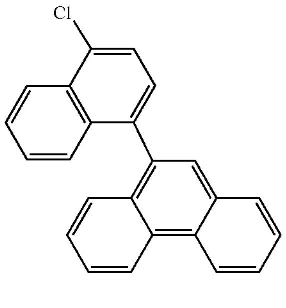

1-3

+

-continued

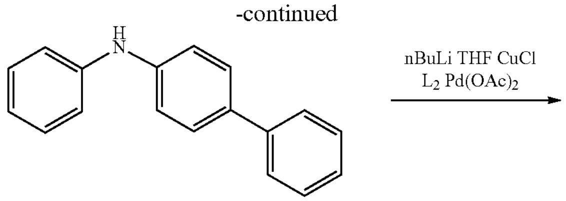

5-4

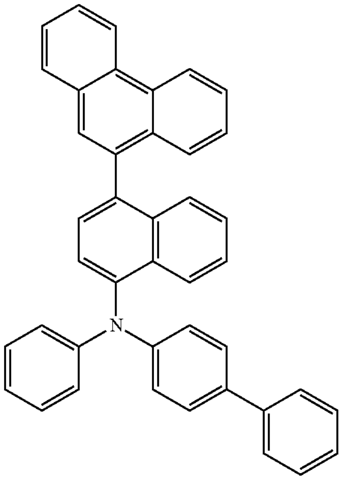

In step 2), the compound 5-4 is added into a three-neck flask, nitrogen is introduced, and then a certain amount of tetrahydrofuran is added. After the solution in the three-neck flask is cooled to −80° C., an n-butyllithium ethane solution is slowly dripped and stirred. Then, a cuprous chloride solution and certain amounts of palladium acetate, trimethoxy triphenylphosphine and the compound 1-3 that are dissolved in tetrahydrofuran are added and stirred at a room temperature, and then water and chloroform are added for extraction. The separated organic layer is dried, subjected to column chromatography, and recrystallized to obtain the compound 5.

Nuclear magnetic resonance (NMR) ($^{13}C$-NMR) data of the compound 5 is: 145.9 (s), 144.8 (s), 140.9 (d), 138.2 (s), 134.2 (s), 133.7 (d), 131.9 (s), 130.3 (s), 129.6 (d), 129.2 (d), 128.8 (m), 128.3 (d), 127.9 (m), 126.6 (m), 126 (s), 125.7 (m), 125.2 (d), 123.2 (d), 122.4 (d), 121.0 (s), 120.1 (s), 119.6 (s), and 109.8 (s).

Experimental Example 1

Molecular structures of the synthesized compound 1 to compound 5 are simulated, and twist angles each between a donor moiety D and an acceptor moiety A are calculated, and a conclusion may be shown in Table 2 below.

TABLE 2

| Compound | Emission spectrum peak-and twist angle (functional-B3LYP) | | | | |
|---|---|---|---|---|---|
| | Twist angle between D and A | N-hexane | Ethyl ether | Tetrahydrofuran | Acetonitrile |
| Compound 1 | 57.6 | 435 | 458 | 488 | 529 |
| Compound 2 | 56.3 | 426 | 449 | 473 | 525 |
| Compound 3 | 58.2 | 439 | 460 | 486 | 533 |

TABLE 2-continued

| | Emission spectrum peak-and twist angle (functional-B3LYP) | | | | |
|---|---|---|---|---|---|
| Compound | Twist angle between D and A | N-hexane | Ethyl ether | Tetrahydrofuran | Acetonitrile |
| Compound 4 | 60.1 | 440 | 458 | 491 | 526 |
| Compound 5 | 54.8 | 438 | 452 | 476 | 511 |

It can be seen from the Table 2 that, the twist angles between donor moieties and acceptor moieties of the compound 1 to the compound 5 are all greater than or equal to 55 degrees and less than or equal to 61 degrees, which is consistent with a conclusion reflected by the orbital distributions, and further proves that the coexistence of the CT state and the LE state in the hybridized way in the compound 1 to the compound 5.

Experimental Example 2

The synthesized compound 1 to compound 5 are each separately dissolved in n-hexane, ethyl ether, tetrahydrofuran and acetonitrile, and wavelengths corresponding to emission spectrum peaks of the compound 1 to the compound 5 are tested, and results are shown in the Table 2. It can be seen from the Table 2 that, as the polarity of the solvent increases, the wavelength corresponding to the emission spectrum peak of each of the compound 1 to the compound 5 increases, that is, the emission spectrum peak has a red shift trend, which indicates that the CT state exist in all of the compound 1 to the compound 5. In combination with the twist angles, it can be seen that all of the compound 1 to the compound 5 have the characteristics of HLCT.

Experimental Example 3

By performing a simulation calculation on radiation decay rates of the synthesized compound 1 to compound 5, results shown in Table 3 below may be obtained.

TABLE 3

| Compound | Radiation decay time (ns) |
|---|---|
| 1 | 12.3 |
| 2 | 13.0 |
| 3 | 16.5 |
| 4 | 15.8 |
| 5 | 14.6 |

It can be seen from the Table 3 that the radiation decay times of the compound 1 to the compound 5 are very short, which indicates that the emission light is fluorescent light.

Experimental Example 4

By calculating energy level differences each between T2 and S1 of the compound 1 to the compound 5 by using B3LYP density functional method, results of the obtained energy level differences between T2 and S1 are shown in Table 4 below. In the Table 4, a comparative compound is a compound in which the donor moiety is a triphenylamine group.

TABLE 4

| Compound | Absolute value of S1-T2 |
|---|---|
| Compound1 | 0.16 |
| Compound2 | 0.14 |
| Compound3 | 0.13 |
| Compound4 | 0.17 |
| Compound5 | 0.19 |
| Comparative compound | 0.58 |

It can be seen from the Table 4 that the energy level differences each between T2 and S1 of the compound 1 to the compound 5 are small, which indicates that the D-A type organic light-emitting material provided by the present disclosure may have an exciton transition channel from T2 to S1. Thus, the excitons in the triplet state may be fully utilized, and the exciton utilization rate may be improved.

Application Example

The application example provides an OLED device. A structure of the OLED device has ITO (indium tin oxide)/HIL (made of HIA and HAT, where HIA:HAT=1:0.03 (a mass ratio), and with a thickness of 20 nm), HTL (made of HIT, and with a thickness of 50 nm), an auxiliary light-emitting layer (made of HTA, and with a thickness of 6 nm), a light-emitting layer (made of a host material (Host) and 5% of a guest material (Dopant), and with a thickness of 20 nm), HBL (with a thickness of 50 nm), ETL with 50% of AIQ (aluminum tris-(8-hydroxyquinoline) (with a thickness of 30 nm), EIL (made of LiF, and with a thickness of 1 nm), and an Al cathode (with a thickness of 100 nm).

Molecular structures of HIA (N2', N7', 10-triphenyl-N2', N7'-bis(9-phenyl-9H-carbazol-3-yl)-10H-spiro[acridine-9, 9'-fluorene]-2', 7'-diamine), HAT ((3, 6, 7, 10, 11-pentakis (aminomethyl)-4b, 8a, 8b, 12a-tetrahydrodipyrazino[2,3-f: 2', 3'-h]quinoxaline-2-carbonitrile), 3, 6, 7, 10, 11-penta (aminomethyl)-4b, 8a, 8b, 12a-tetrahydrodipyrazino[2,3-f: 2',3'-h]quinoxaline-2-carbonitrile), HTA (N-([1,1'-biphenyl]-4-yl)-9,9-dimethyl-N-(4'-(7-phenyl-7H-benzo[c]carbazol-10-yl)-[1,1'-bi phenyl]-4-yl)-9H-fluoren-2-amine), Host, HBL and ETL are shown as follows.

The guest material Dopant is selected from any one of the compound 1 to the compound 5, and obtained devices are denoted as device 1 to device 5 in one-to-one correspondence.

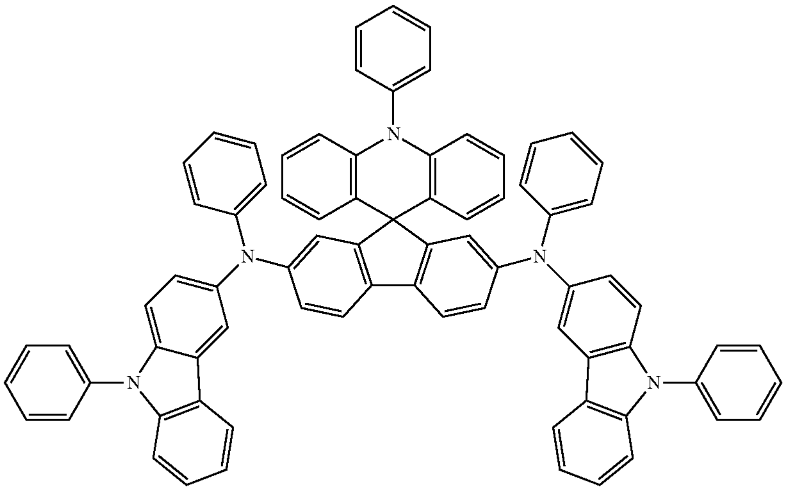
(HIA)
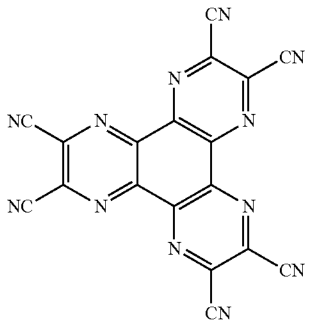
(HAT)
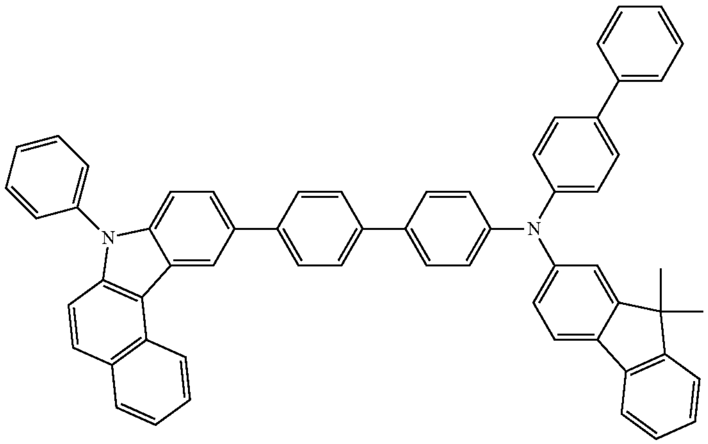
(HTA)
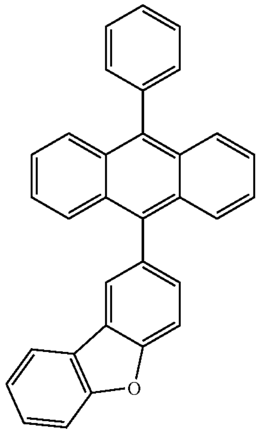
(Host)
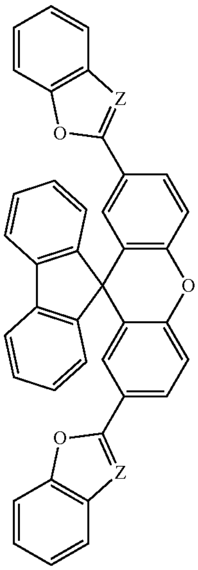
(HBL)
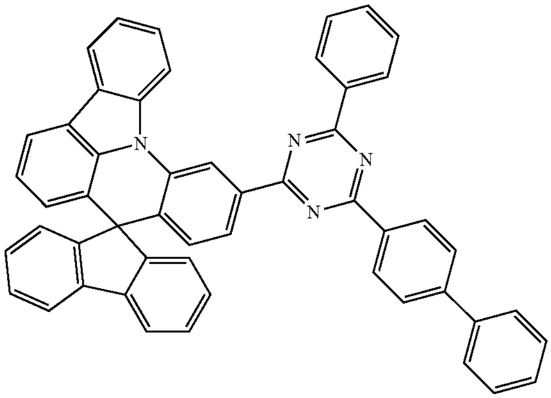
(ETL)

Comparative Example

A structure of a device provided by the comparative example is same as the structures of the devices in the application example, except that the guest material Dopant has a structure shown in the following formula, that is, the guest material adopts the above comparative compound. The device provided by the comparative example is denoted as device 6.

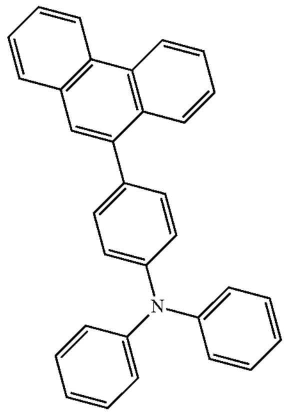 [SMILES: c1ccc(N(c2ccccc2)c2ccc(-c3cc4ccccc4c4ccccc34)cc2)cc1]

Experimental Example 2

A same current density is applied to the device 1 to the device 6, and driving voltages, service lives and current efficiencies of the device 1 to the device 6 are tested, and data shown in Table 5 below are obtained.

TABLE 5

| Sample | Dopant | Driving voltage (V) | Current efficiency (cd/A) |
|---|---|---|---|
| Device 1 | Compound 1 | 4.88 | 106% |
| Device 2 | Compound 2 | 4.61 | 109% |
| Device 3 | Compound 3 | 4.58 | 107% |
| Device 4 | Compound 4 | 4.62 | 108% |
| Device 5 | Compound 5 | 4.78 | 105% |
| Device 6 | Comparative compound | 4.81 | 100% |

It can be seen from the Table 5 that, compared with the comparative compound, in a case of applying the same current density, the current efficiencies of the compound 1 to the compound 5 are all increased to different degrees.

In summary, by modifying a linking position between a donor moiety and a acceptor moiety of the comparative compound, an appropriate donor-acceptor structure is constructed, and the coexistence of the intermolecular charge transfer excited state and the local state is regulated, so that wave functions of the electrons and the holes in the excited state of the D-A type organic light-emitting material have both a separate portion and an overlapping portion in space, which belongs to a hybrid local charge transfer excited state. The characteristics of the excited state can appropriately increase the conjugation of the molecules and expand the overlapping area of the electrons and the holes based on ensuring the charge transfer characteristic of the excited state. As a result, the binding energy of the excitons of the D-A type organic light-emitting material is small, the spin-flip of the electrons in the excited state is easily achieved, the utilization rate of the excitons in the triplet state is improved, and it is possible to avoid the problems of strong CT state, small extent of overlapping, low fluorescent quantum yield and reddish chromaticity of the pure TADF material. In addition, through device testing, it has been found that when used in light-emitting devices, the D-A type organic light-emitting material can improve light-emitting efficiency of the devices.

The foregoing descriptions are merely specific implementations of the present disclosure, but the protection scope of the present disclosure is not limited thereto. Any changes or replacements that a person skilled in the art could conceive of within the technical scope of the present disclosure shall be included in the protection scope of the present disclosure. Therefore, the protection scope of the present disclosure shall be subject to the protection scope of the claims.

What is claimed is:

1. A donor-acceptor (D-A) type organic light-emitting material, comprising:

a donor moiety, the donor moiety being represented by a following formula (I):

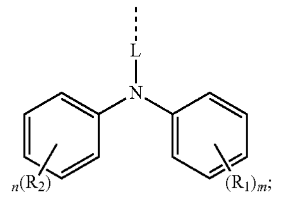

wherein in the formula (I), L is selected from divalent fused heteroaryl, and m and n are each an integer from 0 to 3; and the divalent fused heteroaryl has a substituent, the substituent of the divalent fused heteroaryl is selected from cyano, and a total number of the cyano is not more than 2; and an acceptor moiety, the acceptor moiety being selected from a substituted or unsubstituted fused heterocyclic ring, a number of heteroatoms in the fused heterocyclic ring being not more than 2, and a substituent of the fused heterocyclic ring being R;

wherein R, $R_1$ and $R_2$ are same or different, and are each independently selected from any one of deuterium, halogen, cyano, nitro, amino, $C_1$ to $C_{40}$ alkyl, $C_2$ to $C_{40}$ alkenyl, $C_2$ to $C_{40}$ alkynyl, $C_3$ to $C_{40}$ cycloalkyl, $C_3$ to $C_{40}$ heterocycloalkyl, $C_6$ to $C_{60}$ aryl, $C_5$ to $C_{60}$ heteroaryl, $C_1$ to $C_{40}$ alkoxy, $C_6$ to $C_{60}$ aryloxy, $C_3$ to $C_{40}$ alkylsilyl, $C_6$ to $C_{60}$ arylsilyl, $C_1$ to $C_{40}$ alkylboryl, $C_6$ to $C_{60}$ arylboryl, $C_6$ to $C_{60}$ aryl phosphinyl, $C_6$ to $C_{60}$ mono- or diaryl phosphinyl, and $C_6$ to $C_{60}$ arylamine.

2. The D-A type organic light-emitting material according to claim 1, wherein L is selected from a following structural formula:

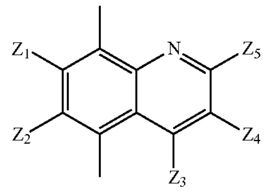

wherein $Z_1$ to $Z_5$ are same or different, and are each independently selected from any one of hydrogen, deuterium, tert-butyl, phenyl, cyano and methylimino; and in $Z_1$ to $Z_5$, the total number of cyano is 1 or 2, and a total number of the cyano and the methylimino is not more than 2.

3. The D-A type organic light-emitting material according to claim 1, wherein a twist angle between the donor moiety and the acceptor moiety is in a range of 35 degrees to 80 degrees, inclusive.

4. The D-A type organic light-emitting material according to claim 3, wherein the twist angle between the donor moiety and the acceptor moiety is in a range of 45 degrees to 60 degrees, inclusive.

5. The D-A type organic light-emitting material according to claim 1, wherein in the D-A type organic light-emitting material, excitons in a triplet state and excitons in a singlet state are in a following relationship:

$$|TN-SM| \leq 0.2 \text{ eV};$$

wherein TN represents the triplet state at an N energy level, SM represents the singlet state at an M energy level, M is an integer greater than or equal to 1, and N is an integer greater than M.

6. The D-A type organic light-emitting material according to claim 1, wherein a radiation decay time of the D-A type organic light-emitting material is less than 30 ns.

7. The D-A type organic light-emitting material according to claim 1, wherein as a polarity of a solvent increases, a wavelength corresponding to a peak of an emission spectrum of the D-A type organic light-emitting material increases.

8. The D-A type organic light-emitting material according to claim 7, wherein the wavelength corresponding to the peak of the emission spectrum of the D-A type organic light-emitting material dissolved in n-hexane, ethyl ether, tetrahydrofuran and acetonitrile in sequence increases.

9. An application of a donor-acceptor (D-A) type organic light-emitting material in an organic electronic device, the D-A type organic light-emitting material according to claim 1.

10. A light-emitting device, comprising:

a light-emitting layer, a material of the light-emitting layer including a host material and a guest material, and the guest material being the D-A type organic light-emitting material according to claim 1.

11. The light-emitting device according to claim 10, wherein the host material is selected from any one or a combination of two or more of anthracene, aromatic amine compounds and derivatives thereof.

12. The light-emitting device according to claim 10, wherein a mass ratio of the D-A type organic light-emitting material in the light-emitting layer is in a range of 0.5% to 10%, inclusive.

13. A light-emitting substrate, comprising:

a base; and a plurality of light-emitting devices disposed on the base, at least one of the light-emitting devices being the light-emitting device according to claim 10.

14. A light-emitting apparatus, comprising the light-emitting substrate according to claim 13.

15. The D-A type organic light-emitting material according to claim 1, wherein R, $R_1$ and $R_2$ are each combined with a respective adjacent group to form a condensed ring.

* * * * *